(12) United States Patent
Kelly et al.

(10) Patent No.: US 10,325,035 B2
(45) Date of Patent: Jun. 18, 2019

(54) INTERACTIVE DIMENSIONING OF PARAMETRIC MODELS

(71) Applicant: Environmental Systems Research Institute (ESRI), Redlands, CA (US)

(72) Inventors: Tom Kelly, Zurich (CH); Pascal Mueller, Zurich (CH)

(73) Assignee: ENVIRONMENTAL SYSTEMS RESEARCH INSTITUTE (ESRI), Redlands, CA (US)

( * ) Notice: Subject to any disclaimer, the term of this patent is extended or adjusted under 35 U.S.C. 154(b) by 551 days.

(21) Appl. No.: 15/073,557

(22) Filed: Mar. 17, 2016

(65) Prior Publication Data
US 2016/0275209 A1  Sep. 22, 2016

Related U.S. Application Data

(60) Provisional application No. 62/134,485, filed on Mar. 17, 2015.

(51) Int. Cl.
*G06F 17/50* (2006.01)
*G06T 19/00* (2011.01)

(52) U.S. Cl.
CPC .............. *G06F 17/50* (2013.01); *G06T 19/00* (2013.01); *G06F 17/5004* (2013.01); (Continued)

(58) Field of Classification Search
CPC ............... G06T 19/00; G06T 2219/004; G06T 2219/012; G06F 17/50
See application file for complete search history.

(56) References Cited

U.S. PATENT DOCUMENTS 4,855,939 A * 8/1989 Fitzgerald, Jr. ......... G06T 19/00
 703/1
5,138,698 A  8/1992 Nowak et al.
(Continued)

FOREIGN PATENT DOCUMENTS

EP  0306989  3/1969
EP  2216754  8/2010
(Continued)

OTHER PUBLICATIONS

Engineering Wave "Dimensioning Arrangements" Web Archive (Aug. 2014) available at <https://web.archive.org/web/20140807002228/https://www.enggwave.com/dimensioning-arrangements> (Year: 2014).*
(Continued)

*Primary Examiner* — Jay Hann
(74) *Attorney, Agent, or Firm* — Kilpatrick Townsend & Stockton LLP

(57) ABSTRACT

Certain embodiments include a computer-implemented method that includes receiving image data corresponding to a three-dimensional (3D) parametric model, receiving a selection of a scope of the 3D model, receiving a selection of one or more base lines for the scope, determining a slip type for the scope, calculating planes of the scope, calculating candidate dimension lines, selecting a dimension line of the candidate dimension lines based on dimension line placement rules, and displaying the selected dimension line adjacent to the scope that correspond to the selected one or more base lines. The calculated planes of the scope can be based on the one or more base lines and the slip type. The calculated candidate lines can be based on the calculated planes and dimension line placement guidelines.

18 Claims, 33 Drawing Sheets
(29 of 33 Drawing Sheet(s) Filed in Color)

(52) U.S. Cl.
CPC .... *G06F 17/5086* (2013.01); *G06T 2219/004* (2013.01); *G06T 2219/012* (2013.01)

(56) References Cited

U.S. PATENT DOCUMENTS

| | | | |
|---|---|---|---|
| 5,548,706 A * | 8/1996 | Koizumi | G06T 19/00 345/441 |
| 5,999,186 A * | 12/1999 | Jackson | G06T 19/20 345/427 |
| 6,904,392 B1 * | 6/2005 | Marty | G06T 19/00 703/1 |
| 7,039,569 B1 * | 5/2006 | Haws | G06F 17/5004 703/1 |
| 7,110,005 B2 * | 9/2006 | Arvin | G06T 11/60 715/769 |
| 7,119,805 B2 * | 10/2006 | Batori | G06F 17/5086 345/419 |
| 8,284,190 B2 | 10/2012 | Muktinutalapati et al. | |
| 8,817,028 B2 * | 8/2014 | Yadav | G06T 19/00 345/419 |
| 2002/0118229 A1 | 8/2002 | Batori et al. | |
| 2004/0201836 A1 | 10/2004 | Chang et al. | |
| 2006/0267980 A1 * | 11/2006 | Onoue | G06T 19/00 345/420 |
| 2007/0115278 A1 * | 5/2007 | Tokumaru | G06T 19/00 345/419 |
| 2013/0204598 A1 | 8/2013 | Mallet et al. | |
| 2014/0067333 A1 * | 3/2014 | Rodney | G06T 19/00 703/1 |
| 2015/0029182 A1 | 1/2015 | Sun et al. | |

FOREIGN PATENT DOCUMENTS

| | | |
|---|---|---|
| EP | 3271900 | 11/2018 |
| WO | 9853429 | 11/1998 |
| WO | 2016149554 A2 | 9/2016 |

OTHER PUBLICATIONS

Yu, K., et al. "A Review of Automatic Dimensioning and Tolerancing Schemes" Engineering with Computer, vol. 10, pp. 63-80 (1994) (Year: 1994).*
Camba, J., et al. "Management of Visual Clutter in Annotated 3D CAD Models: A Comparative Study" Design, User Experience, and Usability, pp. 405-416 (2014) (Year: 2014).*
Bao, et al., "Generating and Exploring Good Building Layouts", http:f/peterwonka.net/Publications/pdfsi2013.SG.Bao.SmartLayout.pdf, 2013, 11 pages.
Kelly, et al., "Interactive Dimensioning of Parametric Models", http:/fpeterwonka.net/Publications/pdfs/20 15.EG.Tom.InteractiveModeiDimensioning.pdf, 2015, 32 pages.
PCT/US2016/022971, "International Search Report and Written Opinion", Aug. 8, 2016, 11 pages.
PCT/US2016/022971, "Invitation to Pay Additional Fees and Partial Search Report", May 5, 2016, 2 pages.
European Patent Application No. 16765790.7, Partial Supplementary European Search Report, dated Oct. 26, 2018, 19 pages.
Kelly et al., Interactive Dimensioning of Parametric Models, Computer Graphics Forum, vol. 34, Issue 2, May 1, 2015, pp. 117-129.

* cited by examiner

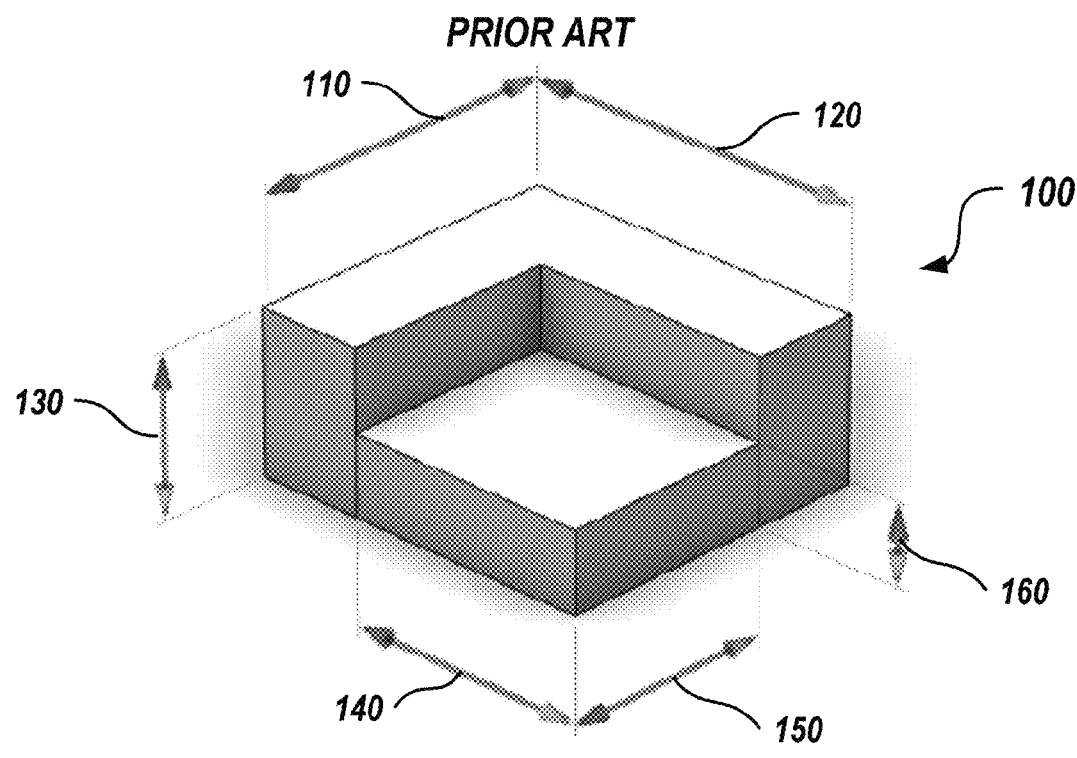
PRIOR ART
FIG. 1
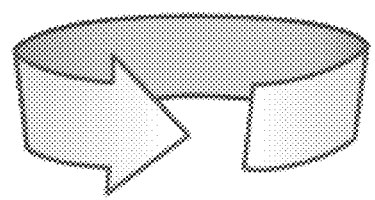
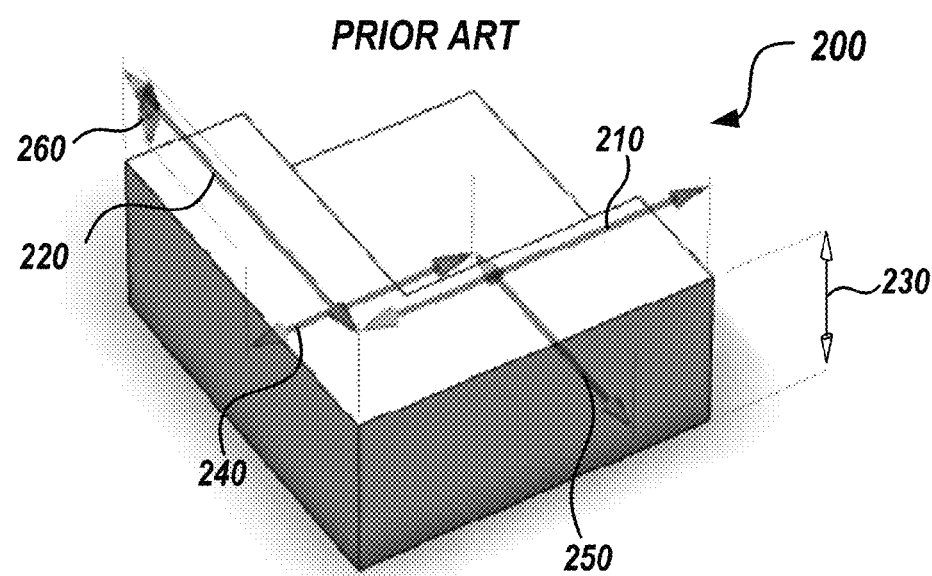
PRIOR ART
FIG. 2

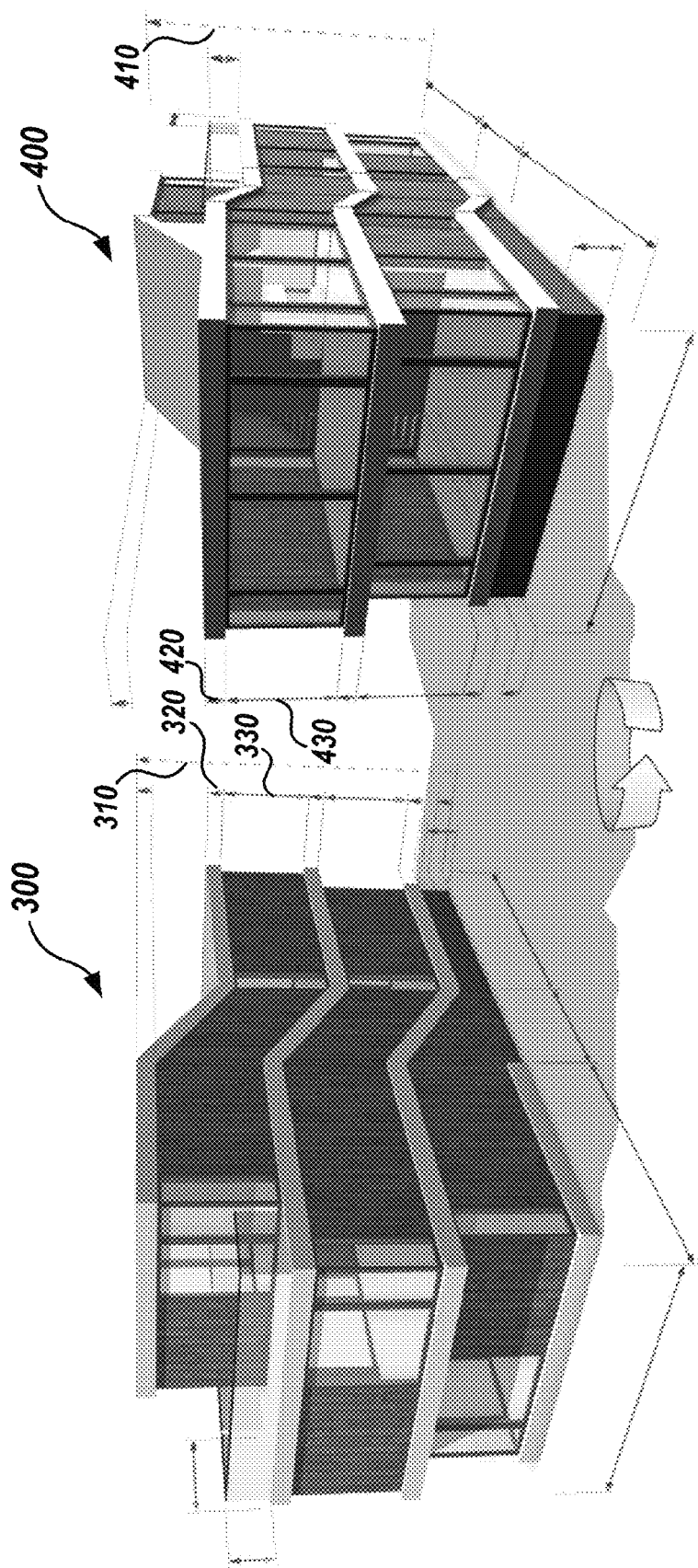

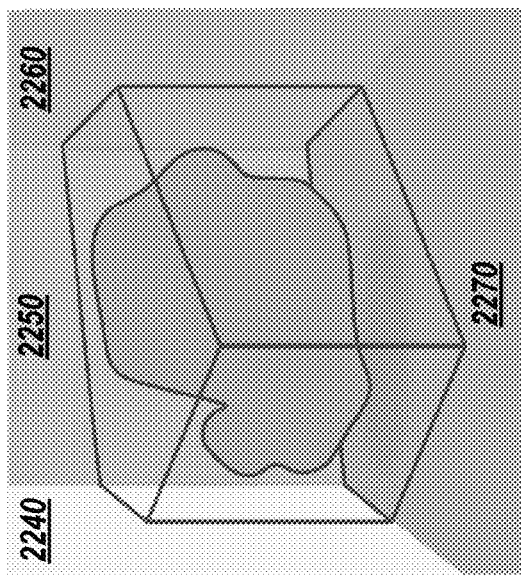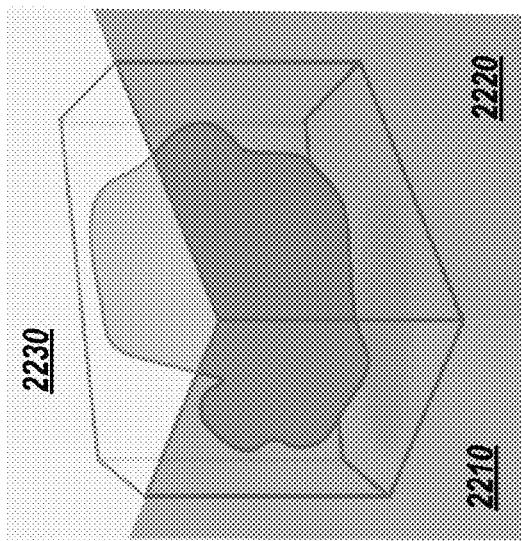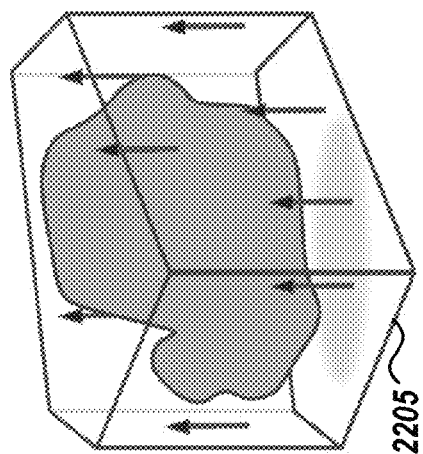
FIG. 22

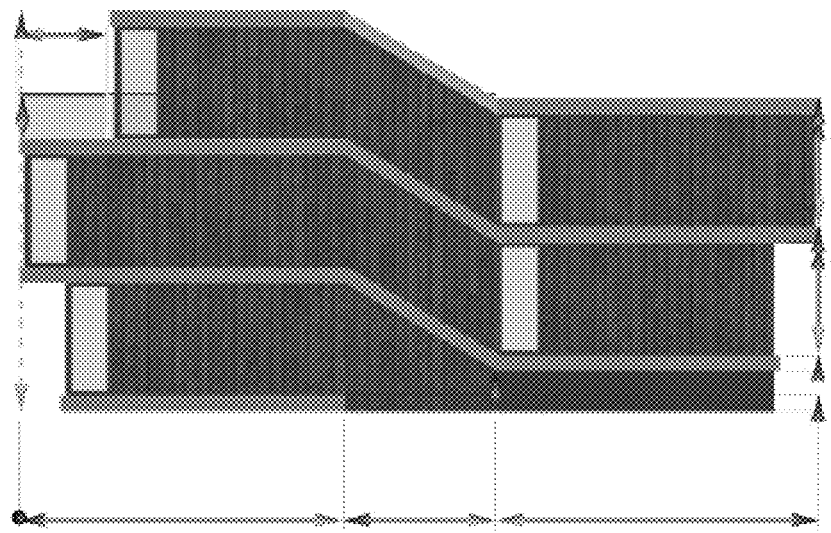
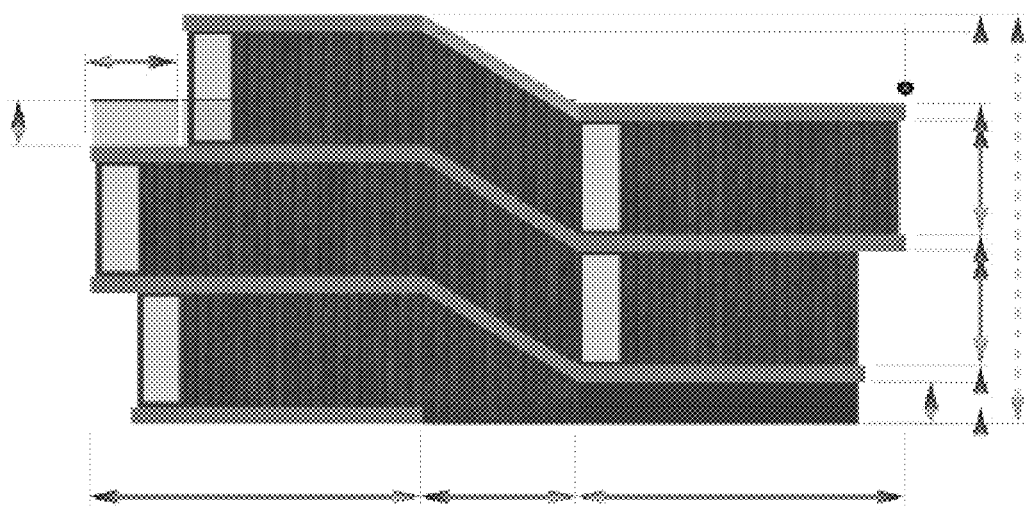
FIG. 26D

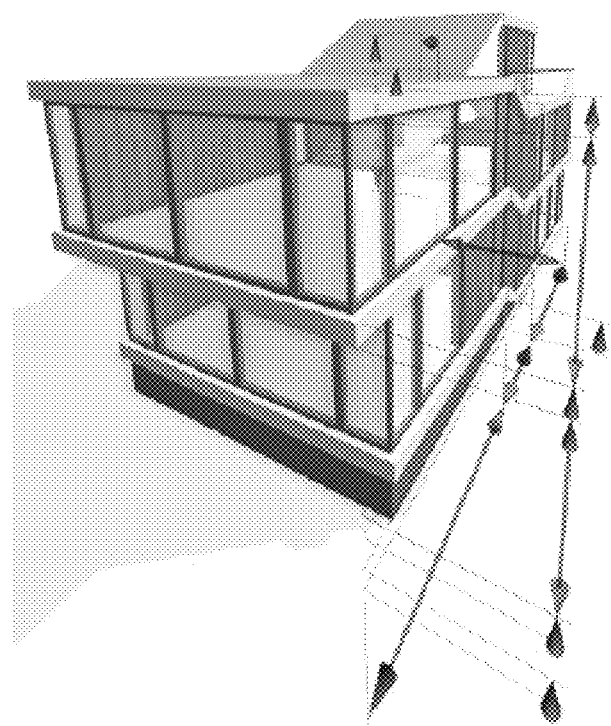
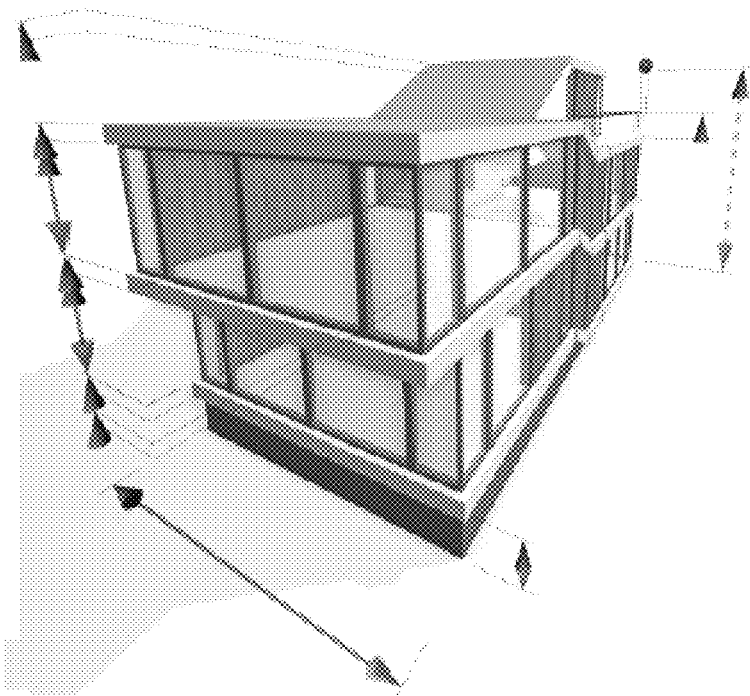
*FIG. 26E*

INTERACTIVE DIMENSIONING OF PARAMETRIC MODELS

CROSS-REFERENCES TO RELATED APPLICATIONS

This application claims priority to provisional application Ser. No. 62/134,485 filed Mar. 17, 2015, entitled "Interactive Dimensioning of Parametric Models," the entire contents of which are herein incorporated by reference in its entirety for all purposes.

BACKGROUND

In computer-aided design, dimensioning conventionally includes the placement of dimension text, dimension lines, and extension lines customized for a single view point. Dimension lines are line segments that indicate the extent of a feature, while extension lines visually connect the ends of a dimension line to the relevant feature in the model.

Dimensioning

Within the field of technical drawing, dimensioning is the specification of the dimensions of a three-dimensional (3D) (world space) object via two-dimensional (2D) (screen space) drawings. The goal is to add a necessary and sufficient number of dimension lines to specify the geometry. Such a drawing may be used, e.g., for defining tolerances during machining. As such, dimensioning is supported by rigorous international standards (e.g., ISO 128-1). Typically, dimensioning takes place on an orthographic or plan drawing.

Some contemporary commercial systems provide for the manual positioning of world space dimensioning lines. For example, some systems allow the author to specify such a world-space dimension line by clicking twice on the model to specify end points, and once to give a offset location for the dimension line. Automatically positioning lines in 2D has been contemplated as well. For instance, knowledge-based automatic dimensioning introduces a rule-based system based on domain knowledge that is implemented in Prolog. Some developments have utilized both a rule-based expert system to dimension 3D objects on a 2D diagram, and techniques such as occluding forbidden zones to constrain dimension lines locations. Some popular contemporary software tools perform a similar role of positioning world space lines in 3D. However, these systems suffer from the fact that as the user rotates the viewpoint, the dimension lines are often occluded by the model or other dimension lines, i.e., they do not interactively adapt to the current viewpoint.

Labeling

Optimally positioning text and symbols on maps, documents, or illustrations in such a way that other labels and critical features are not occluded is typically a computationally expensive operation; typically these problems are NP-hard (Non-deterministic Polynomial-time hard, from computational complexity theory). One study introduced a method for positioning a set of labels near the areas they refer to, thereby avoiding the silhouette of an object in screen space. That is, positioning screen space labels in screen space. Positioning world space geometry in screen space has been contemplated to position non-overlapping subassemblies that explain a machine's function. However, this system requires several minutes to pre-compute geometry; something that is not possible in an interactive (e.g., real-time) editing system. Other efforts have investigated placing labels by example, and positioning labels at interactive frame rates in static or dynamic scenes.

3D Manipulators

The problem of editing with dimension lines is related to 3D manipulation widgets. When a user selects a tool, a number of different widgets may allow the user to manipulate the current object, for example, scale in x, y, or z directions. Early systems positioned such manipulators in world space and have remained in use to the present day. Domain-specific widgets attached to the sub-objects being edited are also a common subject in graphics, and are used to visualize available translations, deformations, or dimensions of an orientated plane. Some contemporary studies propose that authors pre-define several views in which procedural modeling manipulators are well positioned on screen, in contrast to traditional dimensioning techniques in which dimension lines are optimized only for one static view.

Parametric Models

A parametric model takes a number of input parameters and uses these to create corresponding output geometry. Authors can create such models, and users edit the parameters to quickly generate geometry variations, avoiding the need for them to become familiar with the details of the modeling system. Typical examples are parameter-driven scene graphs of 3D packages and node/shape trees generated by procedural modeling systems, for example, CityEngine. Usually the nodes of such hierarchical models all have a (possibly non-unique) name and an oriented bounding box.

Contemporary 3D Modeling Tools

Dimensioning has been incorporated into many contemporary 3D modeling packages. As discussed above, current methods are mainly suited to a static viewpoint and dimension lines are placed on a 2D drawing, or they are fixed in 3D world space such that if the view point changes, the dimension lines can occlude the model, or intersect other dimension lines. This problem is illustrated, for example, in FIGS. 1A and 1B. Better tools are needed to address this issue.

BRIEF SUMMARY

In certain embodiments, a computer-implemented method includes receiving image data corresponding to a three-dimensional (3D) parametric model, receiving a selection of a scope of the 3D model, receiving a selection of one or more base lines for the scope, determining a slip type for the scope, calculating planes of the scope, calculating candidate dimension lines, selecting a dimension line of the candidate dimension lines based on dimension line placement rules, and displaying the selected dimension line adjacent to the scope, the selected dimension line corresponding to the selected one or more base lines. Calculating planes of the scope can be based on the one or more base lines and the slip type. Calculating candidate dimension lines can be based on the calculated planes, and dimension line placement guidelines. The scope may include a type and the method may further include receiving a selection of the type of scope including one of a linear contour type, a linear center type, a diametric type, a radial type, a spherical diametric type, and a spherical radial type.

In some embodiments, the selection of the one or more base lines for the 3D model can be based on the type of scope. The type may include an orientation, and the selection of the one or more base lines for the 3D model can further be based on the orientation of the type. The method can further include determining when the scope is not visible in a current orientation of the 3D model, and removing the placed dimension line until the scope becomes visible. In certain embodiments, the method may further include identifying an existing dimension line associated with the 3D model. Selecting the dimension line of the candidate dimension lines may be further based on whether the existing dimension line is placed in a linear relationship with any of the candidate dimension lines. The slip type can include one of a slip=scope type causing the calculated planes to directly correspond to the scope, a slip=billboard type causing the calculated planes to directly correspond to a current camera view of the 3D model, or an slip=object type causing the calculated planes to directly correspond to dimensions of the 3D model.

In some embodiments, the dimension line placement guidelines can include one or more of the following: dimension lines placed outside of 3D model where possible, dimension lines maintain a minimum defined distance from the 3D model and existing dimension lines, dimension lines located in planes which they apply or normal to a viewing direction of the 3D model, dimension lines are only shown for visible features, avoid placement of intersecting dimension lines, and grouping co-linear dimension lines where possible. In some implementations, calculating planes of the 3D model, calculating candidate dimension lines, and selecting of the dimension line can be performed and dynamically updated in real-time as the 3D model is rotated in a 3D environment. The method can further include displaying a user-manipulatable handle on the selected dimension line, receiving a user input corresponding to a movement of the handle, and manipulating the shape of the 3D model based on the movement of the handle. The handle can be used to dynamically control a length of the one or more base lines in real-time.

In certain embodiments, a computer-implemented system includes one or more processors and one or more non-transitory computer-readable storage mediums containing instructions configured to cause the one or more processors to perform operations including receiving image data corresponding to a three-dimensional (3D) parametric model, receiving a selection of a scope of the 3D model, receiving a selection of one or more base lines for the scope, determining a slip type for the scope, calculating planes of the scope based on the one or more base lines and the slip type, calculating candidate dimension lines based on the calculated planes and dimension line placement guidelines, selecting a dimension line of the candidate dimension lines based on dimension line placement rules, and displaying the selected dimension line adjacent to the 3D parametric model, the selected dimension line corresponding to the selected one or more base lines.

In some embodiments, the scope can further include a type and the method can further include receiving a selection of the type of scope including one of: a linear contour type, a linear center type, a diametric type, a radial type, a spherical diametric type, and a spherical radial type, where the selection of the one or more base lines for the 3D model is based on the type of scope. The type may include an orientation, and the selection of the one or more base lines for the 3D model can further based on the orientation of the type. The system can further include instructions configured to cause the one or more processors to perform operations including determining when the scope is not visible in a current orientation of the 3D model, and removing the placed dimension line until the scope becomes visible.

In certain embodiments, the system can further include instructions configured to cause the one or more processors to perform operations including identifying an existing dimension line associated with the 3D model, where selecting the dimension line of the candidate dimension lines is further based on whether the existing dimension line is placed in a linear relationship with any of the candidate dimension lines. The slip type may include one of a scope slip type causing the calculated planes to directly correspond to the scope, a billboard slip type causing the calculated planes to directly correspond to a current camera view of the 3D model, or an object slip type causing the calculated planes to directly correspond to dimensions of the 3D model. In some embodiments, the dimension line placement guidelines can include one or more of the following: dimension lines placed outside of 3D model where possible, dimension lines maintain a minimum defined distance from the 3D model and existing dimension lines, dimension lines located in planes which they apply or normal to a viewing direction of the 3D model, dimension lines are only shown for visible features, avoid placement of intersecting dimension lines, and group co-linear dimension lines where possible.

In certain embodiments, calculating planes of the 3D model, calculating candidate dimension lines, and selecting of the dimension line is performed and dynamically updated in real-time as the 3D model is rotated in a 3D environment. The system may further include instructions configured to cause the one or more processors to perform operations including displaying a user-manipulatable handle on the selected dimension line, the handle to dynamically control a length of the one or more base lines in real-time, receiving a user input corresponding to a movement of the handle, and manipulating the shape of the 3D model based on the movement of the handle.

In some embodiments, a computer-implemented method includes receiving image data corresponding to a three-dimensional (3D) parametric model, displaying a dimension line adjacent to the parametric model, the dimension line corresponding to a base line on the parametric model, where the dimension line is positioned to avoid obscuring the parametric model, receiving a user input corresponding to a change in a viewpoint of the 3D parametric model, changing the orientation of the 3D parametric model based on the user input, and repositioning the dimension line in real-time as the orientation of the 3D parametric model is changed, wherein the dimension line is positioned such that it does not obscure the parametric model. The method can further include displaying a user-controllable handle on the dimension line to control a length of the corresponding base line, receiving a user input corresponding to a user-manipulation of the handle on the dimension line, and changing the shape of the 3D parametric model based on the user input.

Embodiments of the invention relate to a system for the interactive positioning of dimension lines. A set of design principles for interactive dimensioning are provided including an algorithmic framework incorporating these principles. In some cases, an author can specify the interactive behavior of dimension lines. An algorithm uses this description to select the final dimension line positions from among candidate positions. Multiple extensions, including chained dimension lines, indirect parameters, different handle types (e.g., boolean and rotational handles), and the use of dimension lines for interactive editing. Further, embodiments utilizing this framework can provide interactive frame rates when editing architectural, botanical, and mechanical models.

Systems and methods of the invention are configured for receiving image data corresponding to a three-dimensional (3D) parametric model, displaying the 3D parametric model and a corresponding dimension line, receiving a user input corresponding to a change in a viewpoint of the 3D parametric model, changing the orientation of the 3D parametric model based on the user input, and repositioning the dimension line outside of the newly oriented 3D parametric model to prevent obscuration of the parametric model. The dimension line corresponds to a line on the parametric model and may be user-configurable to control a length of the corresponding line on the parametric model. The dimension line is positioned outside of the parametric model to avoid obscuring the parametric model. In response to changes in a length of the dimension line, systems and methods may recalculate and display the updated 3D parametric model, and reposition the dimension line accordingly.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIGS. 1 and 2 illustrate aspects of a dimension line layout in conventional systems that produce static positions in a world space where multiple undesirable artifacts are present.

FIGS. 3-4 illustrate aspects a dimension line layout that enables a user to interactively inspect a model while dimension adapt when the camera (view point) moves, according to certain embodiments.

FIG. 22 illustrates the computation of a set of object planes, according to certain embodiments.

FIGS. 26a-26e illustrate the creation of dimension lines that are visible, usable, and consistent with dimension line placement principles at a wide range of angles and fields of view, according to certain embodiments.

DETAILED DESCRIPTION

According to certain embodiments of the invention, systems and methods are introduced for interactive dimensioning of parametric and procedural models. The embodiments can be used in traditional modeling packages, or to create simplified intuitive 3D editing tools for novice users, among their many other uses. Editing with interactive dimensioning can be very fast and may only require a minimal understanding of the underlying parametric model. Applications can be found in entertainment, architecture, geography, rapid prototyping, 3D printing, or any suitable environment.

In the traditional form, dimensioning includes the placement of dimension text, dimension lines, and extension lines customized for a single view point. Dimension lines may be line segments that indicate the extent of a feature on a model, while extension lines visually connect the ends of a dimension line to the relevant feature in the model.

Figure 5:
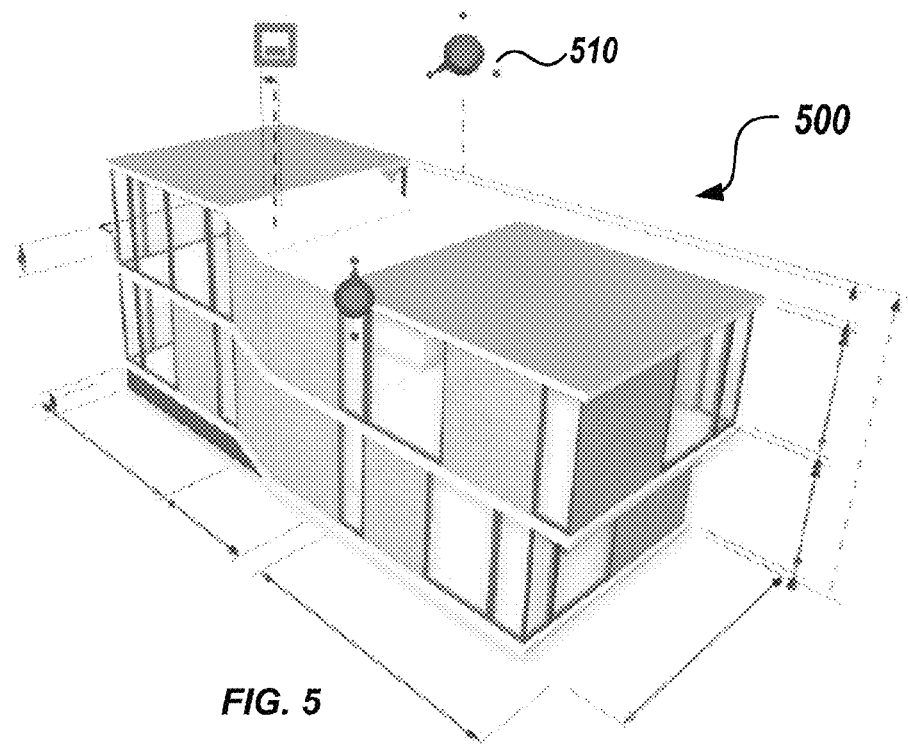
FIGS. 5-6 illustrate aspects of using dimension lines for editing a parametric model as well as extensions that allow the visualization and control of model parameters other than distances, according to certain embodiments.
Figure 6:
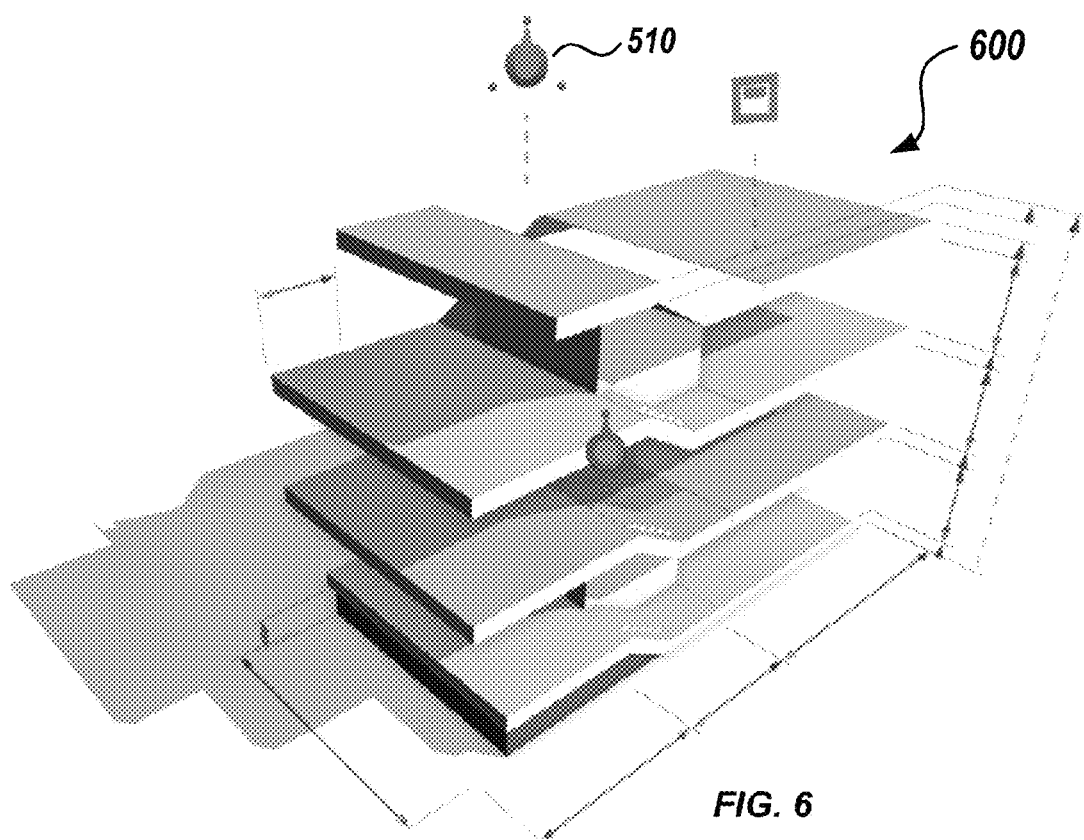

Dimensioning has been incorporated into many 3D modeling packages. However, current methods are mainly suited to a static viewpoint and are typically completely manual. In these methods, dimension lines are placed on a 2D drawing, or they are fixed in 3D world space. If the view point changes, the dimension lines can occlude the model, or intersect other dimension lines (see FIGS. 1 and 2). Embodiments of the invention include a method to extend dimensioning to the interactive, perspective rendering of 3D models. A set of design principles for interactive dimensioning (see FIG. 7 for examples of good and bad dimensioning) is presented, as well as how interactive dimension lines can be defined. An algorithm to position dimension lines in real-time is described, according to a current camera view, as illustrated in FIGS. 3-4. Furthermore, techniques for using dimension lines to edit direct and indirect parameters are described, as shown in FIGS. 5-6. These concepts, optionally combined with novel 3D handles for editing various parameter types, can create a more intuitive user experience than conventional systems.

Thus, certain embodiments of the invention relate to a system for the interactive positioning of dimension lines. A set of design principles for interactive dimensioning are described that provide an algorithmic framework incorporating these principles. In some embodiments, an author can specify the interactive behavior of dimension lines. An algorithm, as defined below, can use this description to select the final dimension line positions from among candidate positions. In some cases, multiple extensions are possible, including chained dimension lines, indirect parameters, different handle types (e.g., boolean and rotational handles—discussed below), and the use of dimension lines for interactive editing. Furthermore, the framework described herein can provide interactive frame rates when editing models (e.g., architectural, botanical, mechanical models, etc.).

FIGS. 1-2 show how conventional systems for dimension line layout produce static positions in world space (see dimension lines 110-160). Such static dimension lines can be undesirable as after being rotated in a three-dimensional view, multiple artifacts can be visible. For instance, some of the dimension lines occlude the model (see, e.g., lines 210, 220, 240, 250), intersect other dimension lines (see, e.g., lines 210, 220, 240, 250, 260), or they no longer have a desirable spacing from the model and other dimension lines (see, e.g., lines 210-260). Note that lines 110-160 correspond to lines 210-260, respectively.

FIGS. 3 and 4 show how a user can interactively inspect a model 300/400 while dimension lines are well positioned in a view-dependent manner, i.e., the dimension lines adapt and move to preferred locations when the camera moves, according to certain embodiments. An architectural structure is shown and rotated counter-clockwise about 180 degrees between FIGS. 3 and 4. Some of the dimension lines are shown to illustrate the concept of preferred placement. Note that dimension lines 310-330 correspond to dimension lines 410-430, respectively.

FIGS. 5 and 6 show how dimension lines can be used for editing a parametric model 500/600, as well as extensions that allow the visualization and control of model parameters other than distances, according to certain embodiments. For instance, handle 510 can be manipulated by a user to alter the parametric model in certain dimensions. Note the preferred placement of the dimension lines as the model is both altered and rotated. Preferred placement guidelines are further discussed below.

Figure 7:
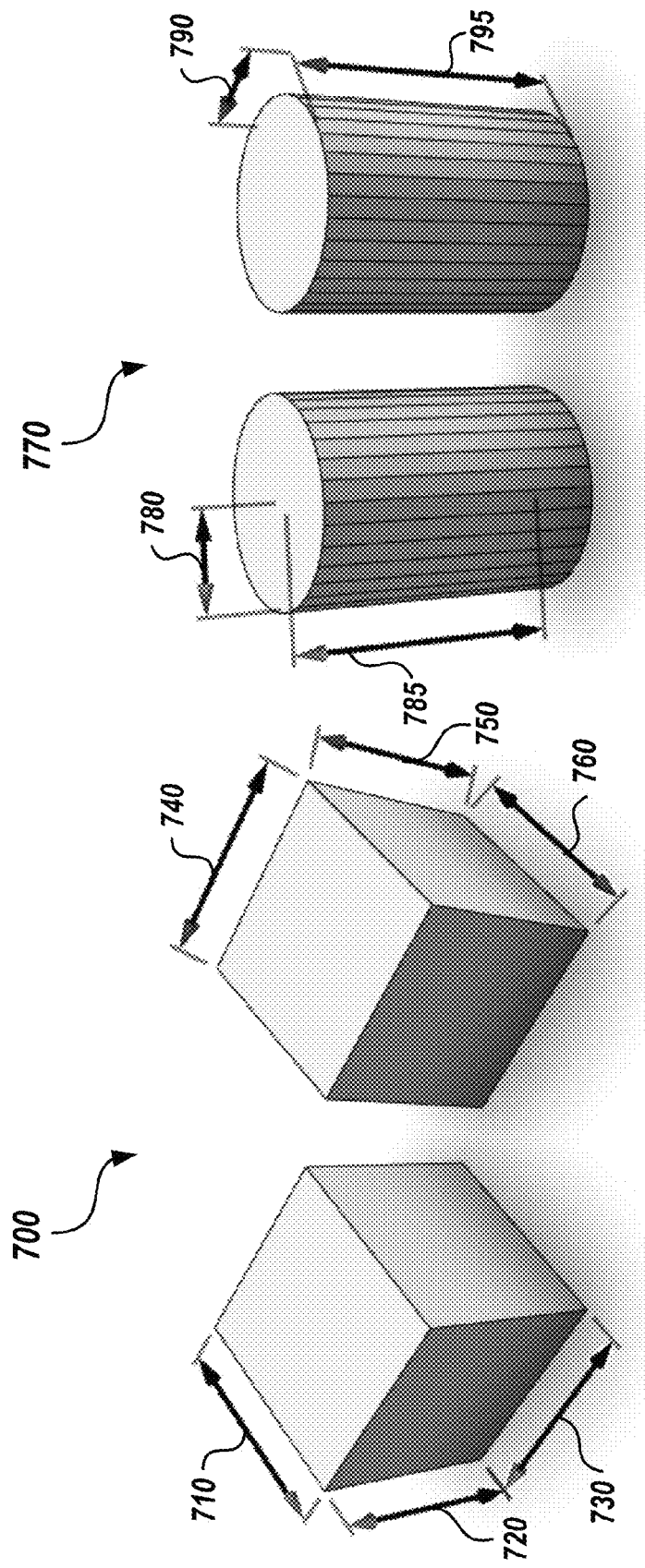
FIG. 7 illustrates aspects of dimension lines positioned in various ways on a model including good and bad positions, according to certain embodiments.

In FIG. 7, dimension lines can be positioned in various ways on a 3D model. According to common design guidelines, there are good positions (dimension lines 710-730 for cubes 700, and dimension lines 780, 785 for the cylinders 770), and bad positions (dimension lines 740-760 for cubes 700 and dimension lines 790, 795 for cylinder 770). The reasons why the dimension lines may be characterized as good or bad positions is discussed below.

Interactive Dimension Lines

In contrast to prior static dimensioning work, embodiments of the invention include systems that do not require the author to manually position dimension lines. Instead, the author can assign a (e.g., numeric) parameter to one or more scopes in the parametric model, and specify the behavior of the resulting dimension line. The system can then interactively compute the best position for the dimension line, given the current camera view, according to the certain interactive design principles (see Interactive Dimensioning Principles) and dimension line properties as further discussed below.

Figure 8:
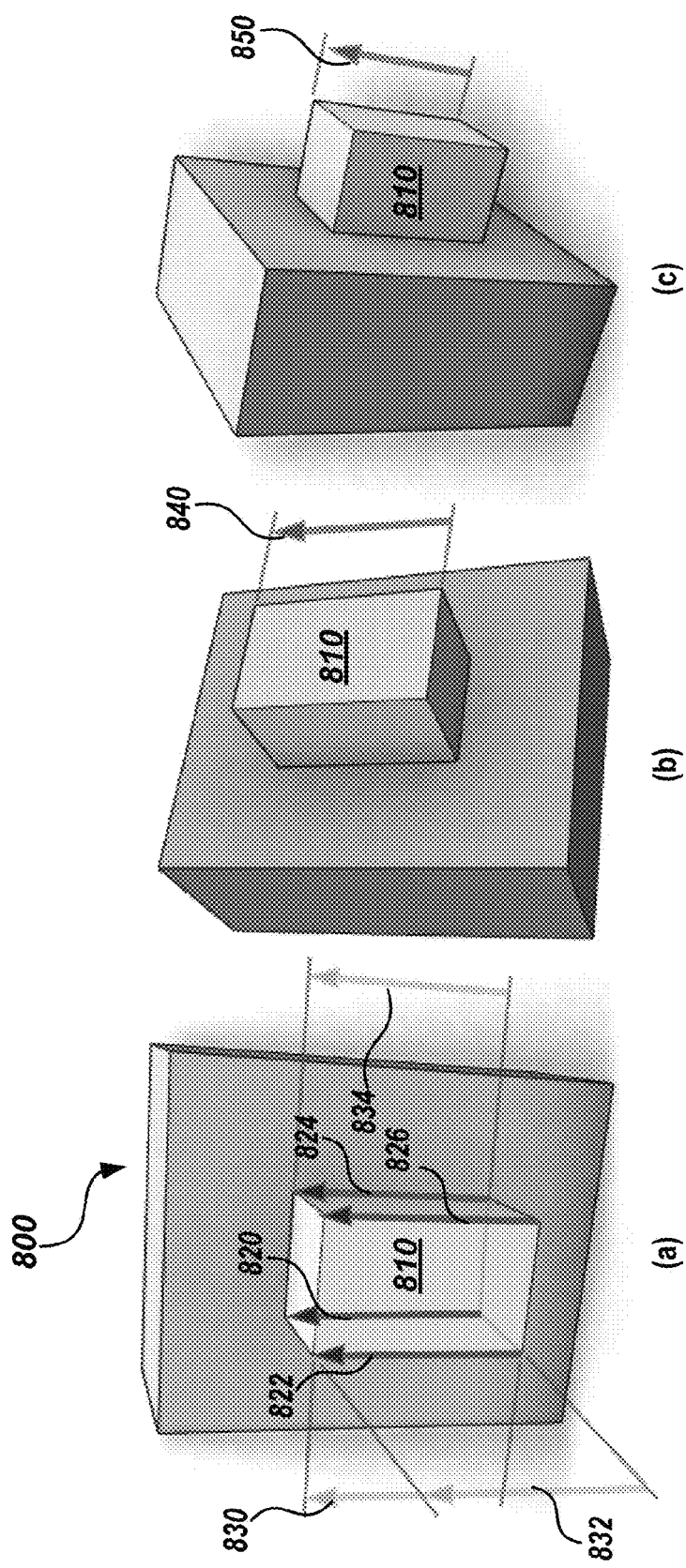
FIG. 8 illustrates aspects of creating an interactive dimension line on a parametric model, according to certain embodiments.

FIG. 8 gives an overview of a real-time computation process for determining a preferred location for a dimension line corresponding to a feature 810 on a rotated parametric model 800, according to certain embodiments. For each frame during rotation, the system evaluates the assigned scope (feature 810) in order to calculate the initial positions for the dimension lines, called base lines (820, 822, 824, 826), as shown in (A). The base lines are then offset to create candidate lines (830, 832, 834—showing a subset of all candidate lines), one of which will be selected. In (a), candidate line 830 would be selected as a final dimension line given its location and adherence to the "Interactive Dimensioning Principles" and a corresponding scoring function that evaluates each candidate line. In (b) and (c), the final dimension line changes its location based on the orientation of the scope and other considerations (e.g., model 800 and interactive dimensioning principles).

In summary, to create an interactive dimension line on a parametric model, the author (e.g., person or machine) assigns a parameter to a scope 810 (yellow), and, per-frame, the system then computes candidate lines (e.g., 830, 832, 834)(light orange) and selects, using a scoring function, a final dimension line (e.g., 840, 850)(dark orange) for a given view direction (see (b) and (c)). The term scope typically refers to a bounding box and its name.

Interactive Dimensioning Principles

One key objective for dimension lines arranged on an object is easy and intuitive comprehension. Thus, to manually place the dimension lines in a preferred manner, a designer makes subjective design choices based on view arrangement, size, function, contour, or spacing, by following certain general guidelines. Thereby, one typically follows common design guidelines and design principles for the interactive positioning of dimension lines.

Figure 9:
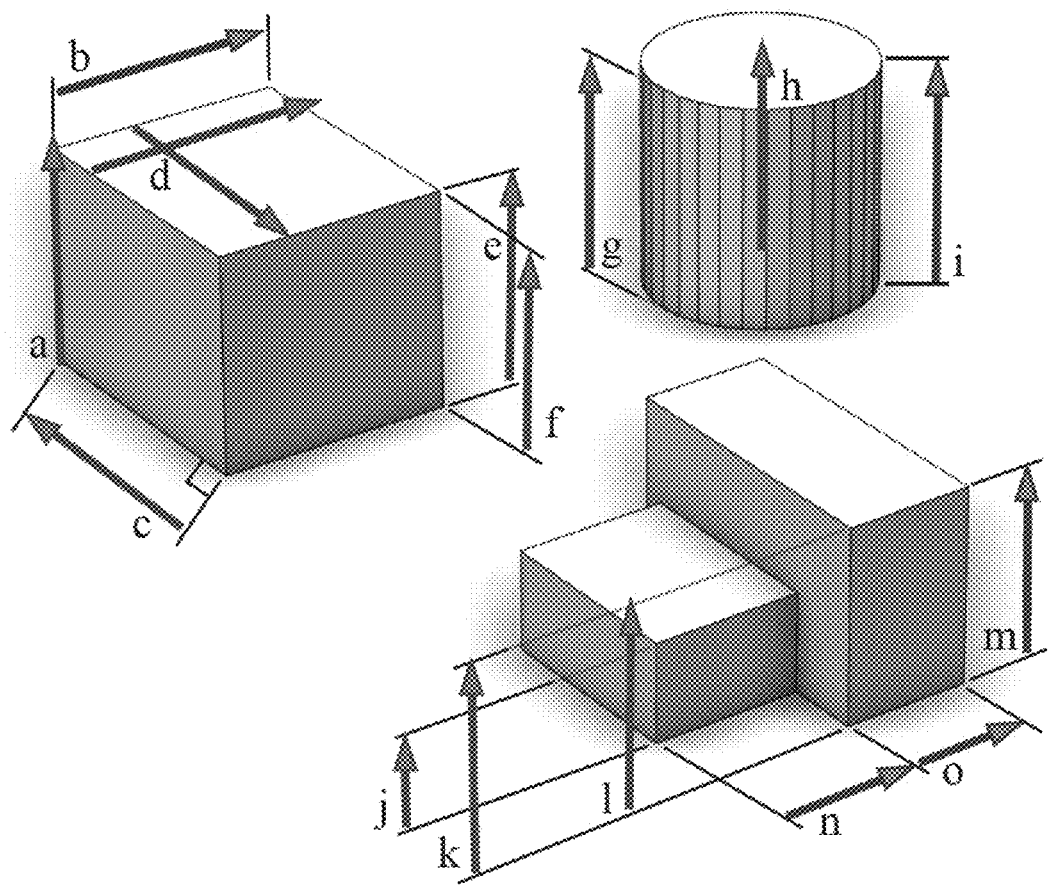
FIG. 9 illustrate examples of good and bad dimension lines to illustrate preferred underlying dimension line placement principles, according to certain embodiments.

FIG. 9 illustrates the implementation and violation of certain guidelines and design principles for interactive positioning of dimension lines on a parametric model, according to certain embodiments. Examples of good (green—b, i, m, n, o) and bad (red—a, c, d, e, f, g, h, j, k, l) dimension lines are shown to illustrate the underlying design principles. The following list of interactive dimensioning principles may not be exhaustive. Other guidelines may be incorporated and, in some cases, may be preferable to the principles listed below.

(1) In some embodiments, dimension lines should be placed outside of the model (e.g., see b and i in FIG. 9) and not obscure the model or its contours (e.g., such as a, d, h and l).

(2) In some embodiments, dimension lines should maintain a minimum screen space distance from the silhouette of the object and from other dimension lines (e.g., unlike e and f). In FIG. 9, for example, a distance of handleSpacing=30 pixels is used. The distance may be a default distance, or may be selected or programmed distance of any suitable magnitude.

(3) In some embodiments, dimension lines should be drawn in the planes to which they apply (e.g., such as b, but unlike c of FIG. 9). In case of curved objects such as a cylinder, they should be drawn in the planes normal to the view direction (e.g., such as i, but unlike g of FIG. 9). This is also shown in FIG. 7 (preferred lines 780, 785 versus non-optimal lines 790, 795).

(4) In some embodiments, dimension lines should be shown for visible features. That is, features that are not visible from a current camera angle (point-of-view) should not have a corresponding dimension line. For example, scope 810 shown in (b) should not include a dimension line if the model 800 was rotated clockwise 180 degrees because it would not be visible.

(5) In some embodiments, dimension lines should be as close to the feature that they measure as possible (e.g., dimension line m is preferable to l or k), but not closer than the minimum screen space distance of item (2) above.

(6) In some embodiments, shorter dimension lines should be placed inside longer dimension lines (e.g., unlike dimension lines j and k. Line j should have been placed inside of k, or closer to the model).

(7) In some embodiments, dimension lines intersecting each other, or intersecting extension lines, should be avoided (e.g., unlike d or k).

(8) In some embodiments, dimension lines should be grouped together (i.e., co-linear or co-planar) as much as possible (e.g., like n and o). FIGS. 3-6 also show good use of co-linear dimension lines (e.g., dimension lines 330 and 340).

(9) In some embodiments, dimension lines should avoid jumping during interactive navigation. For instance, moving a dimension line from one side to the opposite side during interactive navigation (e.g., model or scope rotation) is disfavored and should occur if other candidate lines are not preferable.

(10) In some embodiments, dimension lines should be as long as possible. Due to perspective projection, dimension lines can have different lengths depending on their placement. For instance, in FIG. 3, dimension line 330 is shown longer in FIG. 4 (line 430) because it is closer to the viewing angle (viewer point-of-view). The dimension line in each case extends completely from one end of the feature (building floor) to the other, and not a portion thereof.

Dimension Line Properties

The design principles listed above leave room for many choices. Thus, the author (e.g., human or computer automation) can influence the interactive behavior of the dimension lines by specifying the following properties:

Scope:

The scope can identify a bounding box for applying the dimension line placement principles and positioning the parametric model's base lines. In some cases, a name can identifies zero or more scopes in a parametric model. If multiple scopes have the same name, they may share all properties. In some cases, the model itself can be the scope. For instance, the cube in FIG. 7 may be defined as the scope. A scope may be a portion of an overall object (parametric model). For instance, the rectangular cube 810 of FIG. 8 is the scope of model 800. In another example, a parametric model may be an image of a teapot (not shown). The scope (bounding box) of the teapot may be a cube surrounding it. That is, the scope can describe the space affected by the interactive dimensioning described herein. A user can define the scope. In some cases, scope identification and/or selection can be automated or may be a combination of user/computer contribution.

Figure 10:
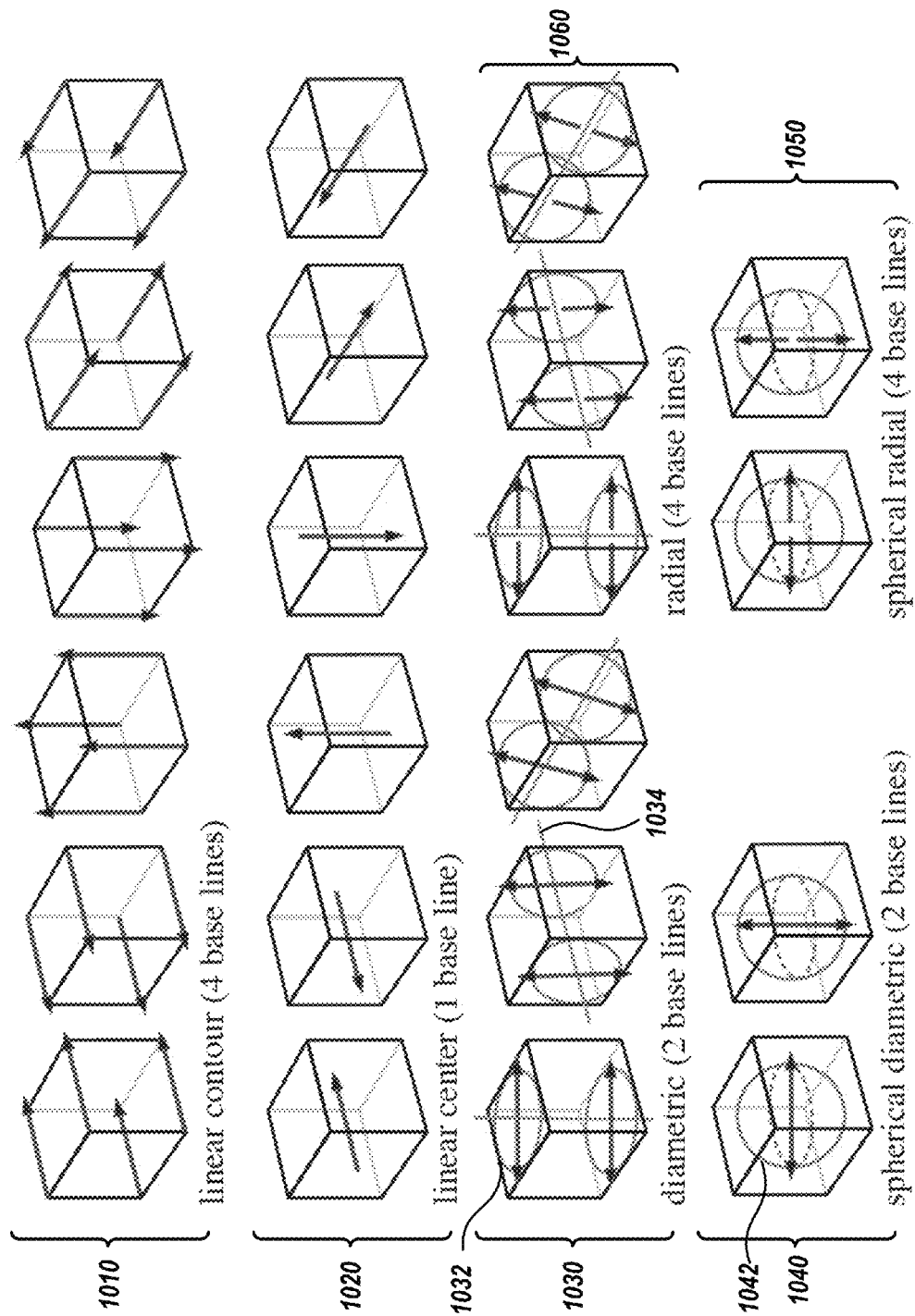
FIG. 10 illustrates a number of examples showing how an author can define a type and orientation of interactive dimension lines for a scope, according to certain embodiments.

Type:

The type can define the position of the base line. The type can be selected by the author, which may be a user or computer. FIG. 10 shows several different types of base lines for a scope including, but not limited to, a linear contour 1010, a linear center 1020, a diametric 1030, a radial 1060, a spherical diametric 1040, and a spherical radial 1050. The type is selected based on the optimal representation. For example, cube 700 of FIG. 7 may be best represented by scope having the same dimensions with a linear contour type the scope includes linear baselines (e.g., a window in a building), a linear contour base line (FIG. 10, row 1010) may be optimal. However, cylinder 800 of FIG. 7 may be best represented by a scope of a diametric type 1030 or radial type 1060. The teapot example above may be best represented by a linear center type 1020. Although the scope may be a cube around the teapot, the dimension line defining a feature of the teapot (e.g., length) may be better represented by the center line. One of ordinary skill in the art with the benefit of this disclosure would understand how to select the type of base line based on the polygonal properties of the object of interest (i.e., the parametric 3D model).

Orientation:

Each type can also have an orientation, either relative to the scope or the screen (i.e., point-of-view of the viewing angle). Linear contour (row 1010) and linear center (row 1020) can have one of six scope relative orientations. Diametric (row 1030) and radial (row 1060) have three scope relative orientations each, which are combined with the camera position to compute the base line locations. Finally, spherical diametric (1040) and spherical radial (1050) base positions are specified by the scope and one of two screen-relative directions. One of ordinary skill in the art with the benefit of this disclosure would understand how to select the orientation of the base line(s) based on the polygonal properties of the object of interest (i.e., the parametric 3D model).

Figure 11:
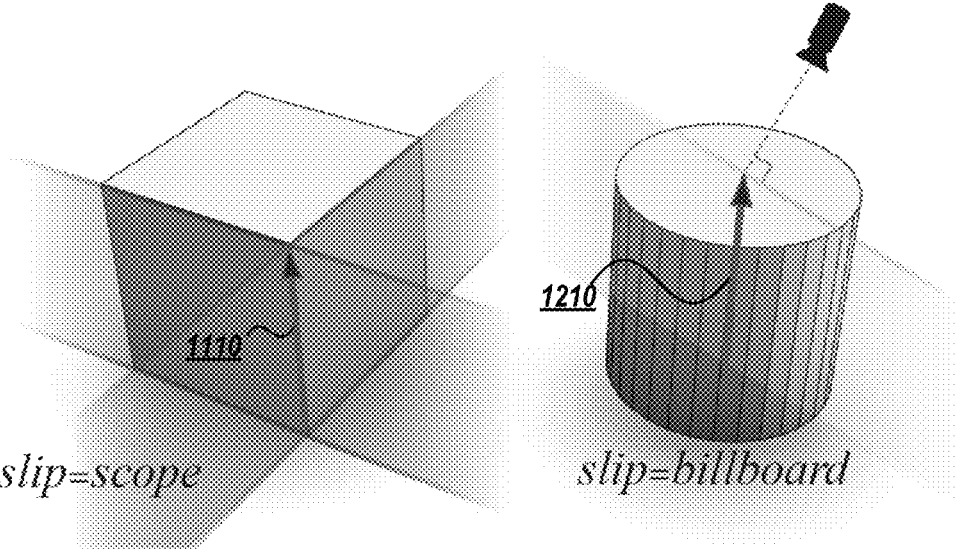
FIG. 11 illustrates two scope aligned planes passing through a base line in a slip=scope configuration, according to certain embodiments.

Slip:

After selecting the scope, type, and orientation, the author can specify the offsetting behavior as object, scope or billboard. This is motivated by design principle 3 (i.e., dimension lines should be drawn in the planes to which they apply) and defines the directions in which the base lines are translated, when they are moved outside the silhouette (i.e., the parametric model) (see also Dimensioning in Real-Time). For example, in FIG. 7 (left cube), the dimension lines are aligned with the 3D planes of the scope. That is, the scope and object (i.e., 3D model) are the same (i.e., slip=scope). The dimension lines are positioned on planes defined by the scope (i.e., they move in the direction of the planes as their placement is determined). FIG. 11 shows an example of where slip=scope may apply. In some cases, slip=scope may be preferred for polygons with planar surfaces.

Figure 12:
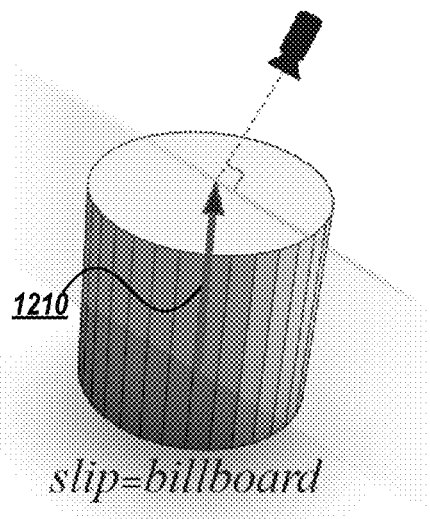
FIG. 12 illustrates a scope aligned single plane passing through the base line oriented in the view direction in a slip=billboard configuration, according to certain embodiments.

In some cases, a slip=scope may not apply. In FIG. 7 (cylinders 770), the direction that the dimension lines move would not be best represented by the direction of the scope (e.g., cube-shaped bounding box). Here, the preferred representation is perpendicular to the viewing angle (i.e., "camera view"), or slip=screen (billboard). Referring back to FIG. 7, the cylinder on the left is set to slip=billboard, and the cylinder on the right is set to slip=scope. FIG. 12 shows an example of where slip=billboard may apply. In some cases, slip=scope may be preferred for polygons with curved surfaces.

Figure 13:
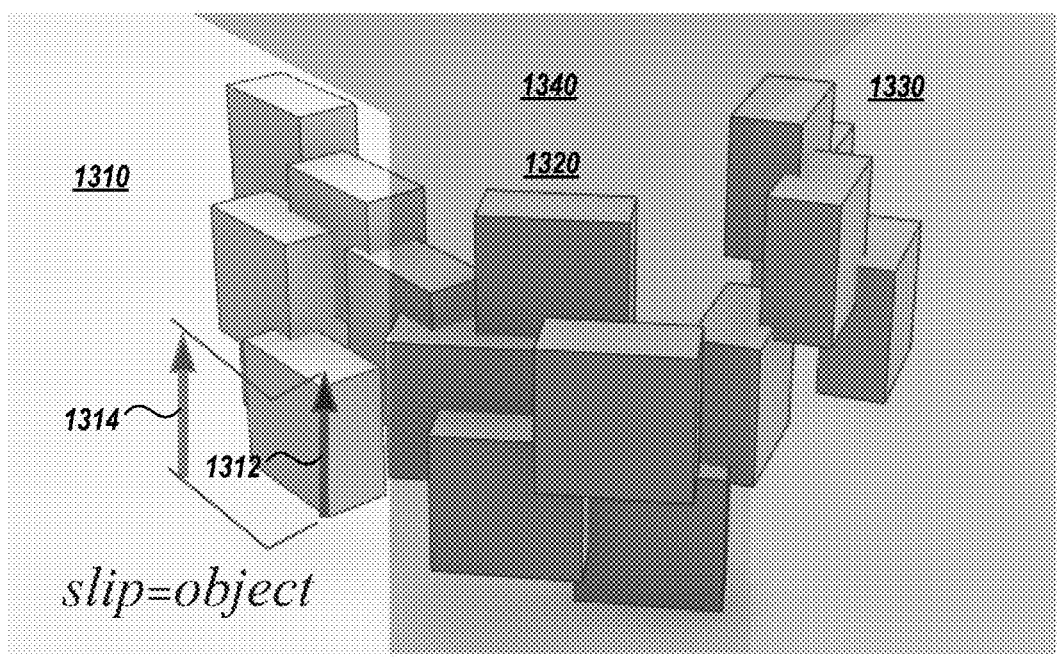
FIG. 13 illustrates a set of global planes aligned to the model's geometry in a slip=object configuration, according to certain embodiments.
Figure 21:
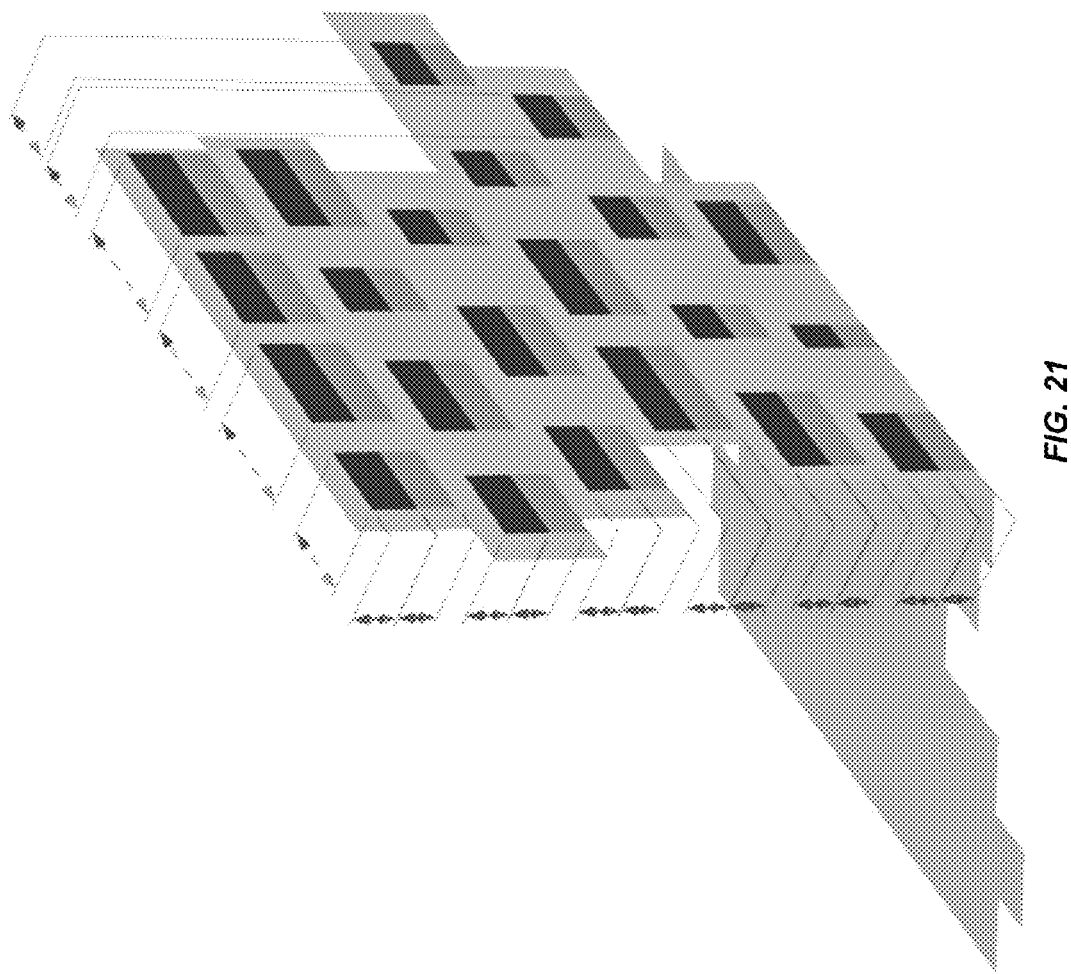
FIG. 21 illustrates a facade with 3 parameters dimensioned using chain lines, according to certain embodiments.

A third slip type is slip=object. Slip=object is similar to slip=scope, but it applies to the entire object, which may be the entire parametric model. For example, referring back to FIG. 8, feature (rectangular box) 810 can either be defined as a portion of the model 800 with slip=scope (scope being feature 810 itself), or the entire parametric model 800 can be selected with slip=object, such that the best planes to place the dimension lines are found around the entire model 800 as a whole. FIG. 13 shows several planes 1310-1340 found around object 1300 that can be used to determine dimension lines. FIG. 21 shows an object having several base lines with slip=object. One of ordinary skill in the art with the benefit of this disclosure would understand how to select the slip based on the polygonal properties of the object of interest (i.e., the parametric 3D model).

Alignment:

Finally, the author can specify the preferred dimension line location: top, bottom, left, right, top-left, top-right, bottom-left, bottom-right, or no-preference. This permits the authoring of predictable layouts (e.g., a height dimension line that is on the screen-right of the model), and leads to more stable positioning during navigation.

For example, in common practice the height of a cuboid is dimensioned using the linear contour type combined with the scope-aligned behavior, as in FIG. 10 (type=linear contour, orientation=up, slip=scope). Another common use case is the billboard behavior applied to the types linear center, diametric or radial. The typical example is a cylinder with a height parameter (type=linear center, orientation=up, slip=billboard) and a diameter parameter (type=radial, orientation=up, slip=billboard), as green dimension lines of FIG. 7, cylinder 770. However, all behaviors can be applied to any type and direction.

Referring back to FIG. 10, the author can define type and orientation of the interactive dimension lines. In Row 1010: The base lines for the linear contour type are placed on the edges of a scope (cube). This results in four distinct base lines depending on the specified orientation. In Row 1020: One base line is placed in the middle of the scope for the type linear center. In Rows 1030 and 1060: Diametric & radial types are most suited to cylindrical objects. To position these base lines, ellipses (1032) are located on scope faces identified by the orientation; the cross product of the view direction and ellipse normal (1034) is then projected onto the ellipse to find the base line orientation. In Row 1040 and 1050: Spherical diametric & spherical radial types are suited to spherical objects. These align a sphere (1042) within the scope, positioning base lines with either horizontal or vertical screen-space orientation within the sphere.

Dimensioning in Real-Time

Some underlying methods of a real-time dimensioning system are described, according to certain embodiments. Typically, each parameter in a parametric model may be processed to find a final dimension line. To illustrate, one parameter may give rise to 1-4 base lines for a single scope. Each base line can be associated with 1 or more planes, depending on the slip behavior. For each pair (base line, plane) we can create up to 2 candidate lines. One candidate line can be selected as the final line to be rendered. During interactive navigation by the user, the system computes this position of each parameter's final line per frame. That is, as a model is manipulated (e.g., rotated, sized, etc.), the system computes a dimension line for one or more parameter of the parametric model in real-time—computing and selecting a final line for every frame of the 3D representation.

Each slip behavior can translate base lines in different directions to find candidate lines outside the silhouette. This slip direction can be defined by a partially bounded plane associated with each base line. If final lines have already been placed on the plane, it may be possible to position the candidate in a co-linear fashion to one of these lines. Otherwise, the base line "slips" along the plane, parallel to itself in world space, until it is outside the silhouette. There can be three options for defining planes: scope and billboard (see FIGS. 11 and 12) create planes relative to the base line, while object (see FIG. 13) uses a global pre-computed plane set. As illustrated in FIGS. 7-8, different models require the author to select different slip behaviors. If this process fails to find any candidate lines, the final line can be positioned inside the silhouette (object).

Referring back to FIG. 10: getScopePlanes in Algorithm 1 (below) aligns two scope aligned planes through base line 1110. For FIG. 11: getBBoardPlanes creates a single plane through base line 1210, oriented in the view direction.

Referring to FIG. 13: $P_{object}$ defines a set of global planes (1310-1340) aligned to the model's geometry. In such cases, the planes may not typically pass through the base line's scope. A base line 1312 finds a candidate position (1314) on a plane (1310).

Algorithm 1 (see below) gives an overview of this process, according to certain embodiments. It describes how the final dimension line for a parameter p is computed for the viewpoint v (i.e. point-of-view, camera angle). The function getDimensionLine is called for each parameter in an ordered list of parameters (e.g., for a parametric model).

---

Algorithm 1 getDimensionLine (p, v)

---

1: if¬ isScopeVisible (p.scope, v) then return Ø
2: B = getBaseLines (p.scope, p.type, p.orient, v)
3: if p.slip=scope then P = getScopePlanes(B, p.scope)
4: else if p.slip=billboard then P =getBBoardPlanes(B, v)
5: else P = $P_{object}$
6: G = findExistingGuidesOnPlanes(P, $G_{snap}$)
7: C = getCandidatesOnGuides(B, G)
8: if C=Ø then C = computeWithSilhouette(B, P, v)
9: if C=Ø then C = B
10: d = computeWinner(C, p.align, v)
11: add d to $G_{snap}$
12: return d

---

In line 1, a dimension line is eliminated if all scopes lie outside the view frustum, or are obscured by the model (e.g., using hardware occlusion from the previously rendered frame), which corresponds to item (4) of the interactive dimensioning principles. Thus, if the scope is obscured or not visible, then the process ends. If the scope is visible, the base line set, B, can be set up according to the properties defined by the author. In lines 3-5 of Algorithm 1, the set of planes P on which candidate lines will be positioned are computed. FIGS. 11-13 illustrate how planes are generated depending on the property slip. In case the latter is object, the set of object planes $P_{object}$ is used. $P_{object}$ can be pre-computed by clustering base lines, as described below with respect to object plane locations.

Figure 14:
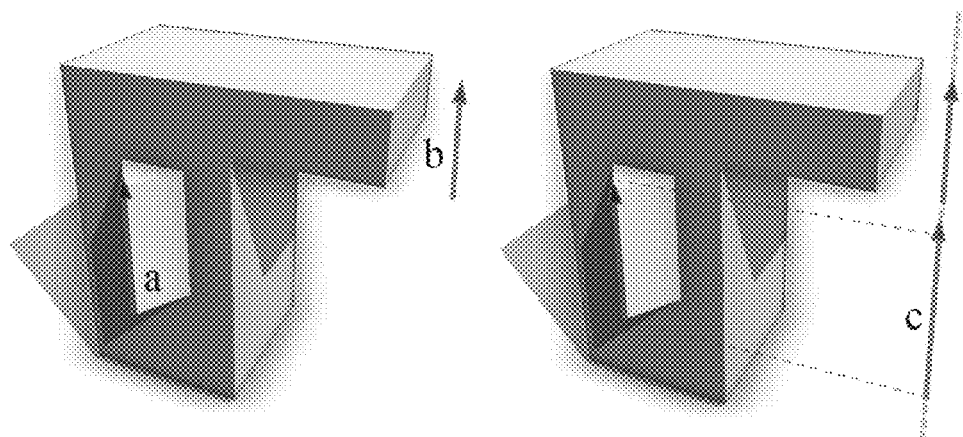
FIG. 14 illustrates the process of finding a guide line and using it to position a new candidate line, according to certain embodiments of the invention.

Next, dimension lines are grouped together (according to principle 8), if possible. Therefore, a per-frame global set of guide lines, i.e., positions to snap to: $G_{snap}$, is maintained. These guide lines can correspond to dimension lines from previously processed parameters (see line 11). Thus, in line 6, all the guides in $G_{snap}$ that lie on the planes in P may be found. From the resulting set of guides, G, the guides with available space to place our dimension line are selected. This process is illustrated in FIG. 14. This results in our candidate lines on guides, C. In the case that C is empty at this point, the candidate lines cannot snap to an existing guide (line 8), and a new candidate line using the silhouette algorithm is computed (see Silhouette Line Placement). If, again, C is empty, the base lines (line 9) can be a fallback position. This can result in a dimension line placed inside the object fallback behavior when the user has zoomed in and the silhouette is not visible.

In line 10, the best possible (i.e., preferred) line, d, may be selected from the set of candidate lines, C, using a scoring function (see Finding the Final Dimension Line).

Referring back to FIG. 14, the left image shows a final line (b) in $G_{snap}$, and a baseline (a) which is being processed. In the right image, the guide line (dashed orange) is on the same plane as (a), and is used to position the new candidate line (c).

Figure 16:
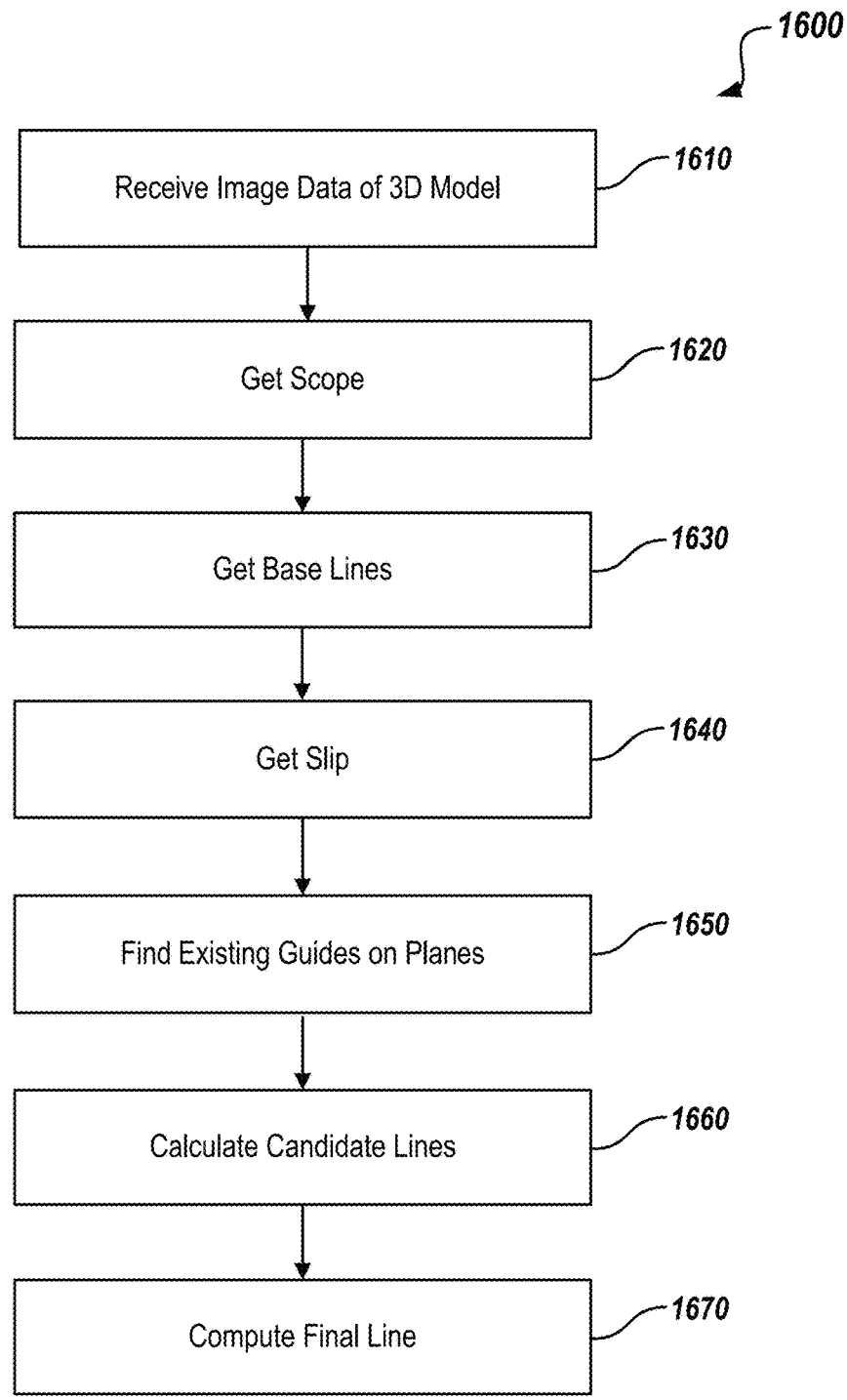
FIG. 16 is a simplified flow diagram showing aspects of generating a dimension line, according to certain embodiments.

FIG. 16 shows a simplified flow chart 1600 for generating a dimension line for a parametric model, according to certain embodiments. Method 1600 (as well as the methods depicted in FIGS. 32-33 discussed below) can be performed by processing logic that may comprise hardware (circuitry, dedicated logic, etc.), software operating on appropriate hardware (such as a general purpose computing system or a dedicated machine), firmware (embedded software), or any combination thereof. In certain embodiments, method 1600 can be performed by processor 2530 of FIG. 35, multiple processors, or other suitable computing device, as discussed with respect to FIG. 35. Method 1600 can correspond to Algorithm 1 above, according to certain embodiments.

At step 1610, method 1600 includes receiving image data corresponding to a three-dimensional parametric model. The parametric model can be any suitable size or shape. Any type of image data can be processed (e.g., CAD, .dwg, LIDAR, or other suitable 3D data). At step 1620, method 1600 includes receiving a selection of a scope of the 3D model. If the scope is obscured or is not visible, then method 1600 ends.

At step 1620, method 1600 includes receiving one or more scopes of the parametric model. The scope may be selected by a user or the selection may be automated, as discussed above. At step 1630, method 1600 includes receiving the base lines for the scope. A single base line or multiple base lines may be selected. In addition to the base lines, the type and orientation of the base lines are selected, as further discussed above. At step 1640, method 1600 includes determining a slip type for the scope. The slip type and the one or more base lines can be used to determine (calculate) what planes are used to calculate candidate dimension lines. Typically, if slip=scope, planes can be used directly from the scope (e.g., top, left, bottom, right, etc.) and these fixed planes can be stored in P (see Algorithm 1). If slip=billboard, then billboard planes are calculated, which are typically normal or perpendicular to the base line and camera view and usually occurs per base line. If slip=object, planes encompassing the object (3D model) are calculated.

At step 1650, method 1600 includes finding existing guides (e.g., existing candidate dimension lines) on planes. FIGS. 3-4 and 14 show aspects of finding existing guides for co-linear placement (as per interactive dimensioning principle 8) and storing their locations. At step 1660, method 1600 includes calculating candidate dimension lines based on the calculated planes, dimension line placement guidelines (interactive dimensioning principles), and the existing guide-lines (if they exist). If no guides exist, then the candidate dimension lines may be computed using the silhouette (scope).

At step 1670, method 1600 includes computing and selecting a final dimension line from the candidate dimension lines based on the dimension line placement rules and displaying the selected dimension line adjacent to the scope. In some cases, no suitable candidate lines may exist adjacent to the scope and the dimension line may be placed inside the scope adjacent to or on the corresponding base line.

It should be appreciated that the specific steps illustrated in FIG. 16 provides a particular method 1600 of generating a dimension line for a parametric model, according to certain embodiments. Other sequences of steps may also be performed according to alternative embodiments. For example, alternative embodiments may perform the steps outlined above in a different order. Moreover, the individual steps illustrated in FIG. 16 may include multiple sub-steps that may be performed in various sequences as appropriate to the individual step. Furthermore, additional steps may be added or removed depending on the particular applications. One of ordinary skill in the art would recognize and appreciate many variations, modifications, and alternatives of the method 1600.

Silhouette Line Placement

This section describes an approach to computing offset candidate locations (computeWithSilhouette in Algorithm 1), given a set of base lines, B, a set of planes, P, and camera viewpoint v, according to certain embodiments. Although the following descriptions describe specific steps as being performed by "we," it should be understood that "we" can indicate a software algorithm performing the step, a user providing input to the step (e.g., providing image data, identifying a scope, etc.), or any other actor, as would be understood by one of ordinary skill in the art.

Figure 15:
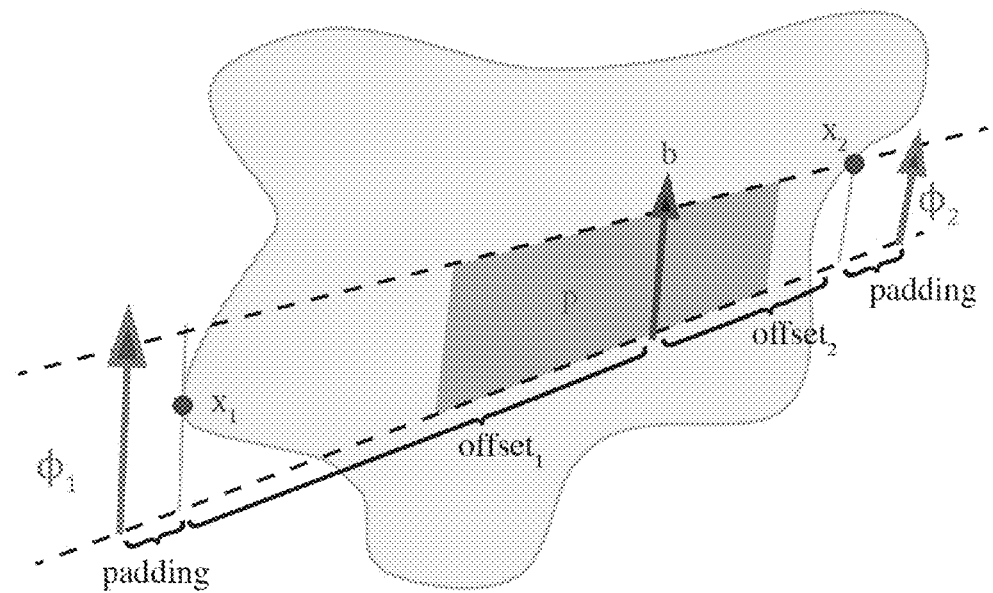
FIG. 15 illustrates the geometric construction of candidate lines, according to certain embodiments of the invention.

For each line in B, we can project it onto each plane in P, creating the pair (b, p). If b does not lie on p, we reject the pair; otherwise we may continue to compute up to two candidate locations outside the model silhouette per pair (b, p). Intuitively we can find the candidates by sliding b along p, self-parallel in world space, until it is outside the model's screen space silhouette (e.g., see FIG. 15). For each input line and plane there can be two opposite offset directions on the plane, which create two possible candidate lines. One base line may be processed several times if it is associated with multiple planes in P.

The sliding calculation may proceed in two steps. First, we can compute the minimal offset such that the dimension line does not intersect the model, but only touches the silhouette. Two touching points are given as $x_1$ and $x_2$ in FIG. 15. Second, we offset these minimal positions (design principle 2) by a padding distance, handleSpacing=30 pixels. This results in the final candidate lines ($\varphi_1$ and $\varphi_2$ in FIG. 15). In some instances, the second step may be trivial, so focus is placed on the first step in the following.

Figure 17:
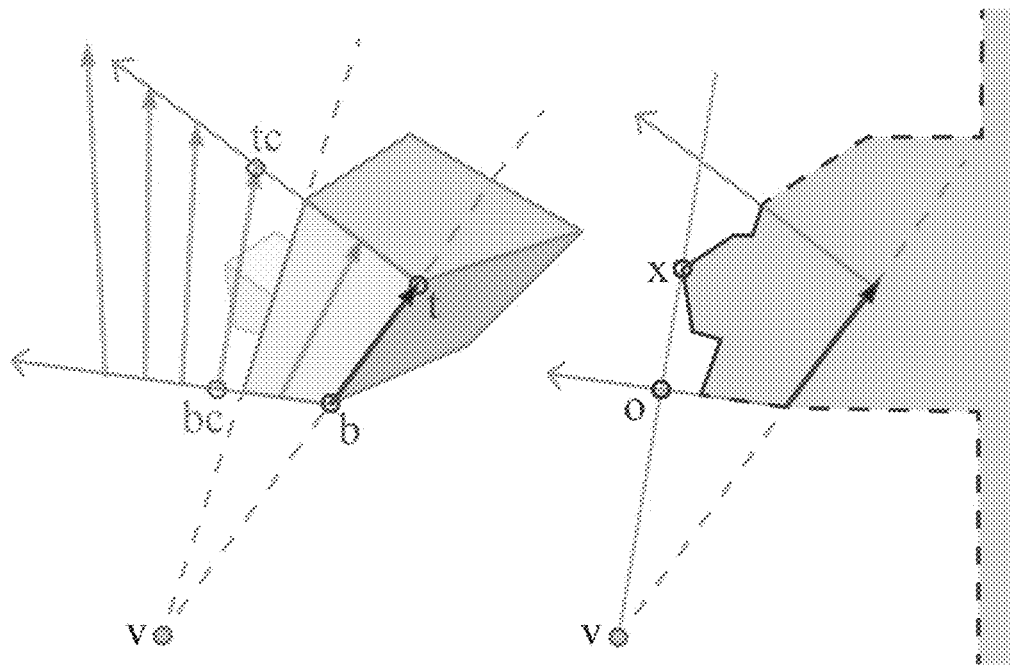
FIG. 17 illustrates two dimensional screen space offset calculations, according to certain embodiments.

A detail of the minimal offset calculation is that, in the general case, extension lines that are parallel in world space are not parallel in screen space. Furthermore, the candidate lines may not be parallel to the base. These issues are illustrated in FIG. 17, left, showing a scope's base line, b-t, and possible minimal offset lines, bc-tc, with different 2D orientations and lengths, due to perspective. These lines share a common vanishing point, v. A model in an orthographic projection does not have a vanishing point, but this case can be simulated by a virtual vanishing point at a large distance. In FIG. 17, right, o gives the minimal offset as v-o lies to the left of all the clipped distance field, only touching at x.

Figure 18:
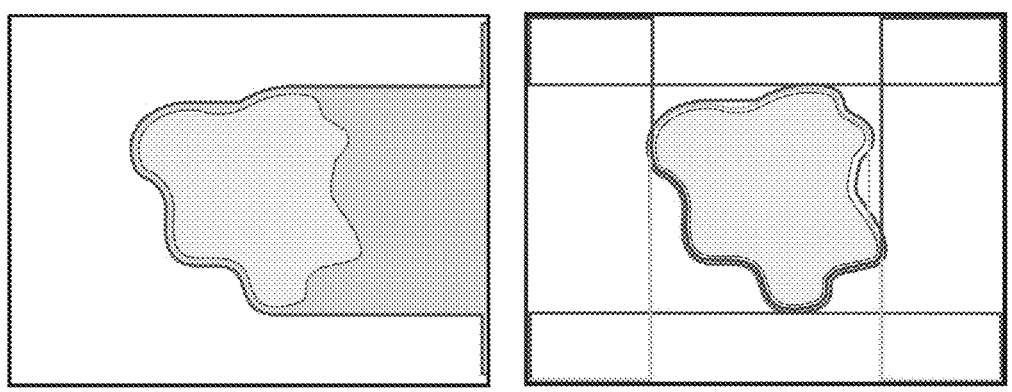
FIG. 18 illustrates the computation of four distance fields to approximate the silhouette of the model, according to certain embodiments.

The minimal offset calculation can be accelerated using the GPU to reduce the performance penalty associated with the model's geometric complexity. Initially we may render four one-dimensional distance fields, from the four edges of the viewport (see FIG. 18), on the GPU. For example, for the distance field form the left viewport boundary we may obtain one distance value for each pixel-row over the height of the viewport. The distance value specifies the horizontal distance from the left boundary to the model's silhouette.

Together, the four distance fields may approximate the model silhouette. Typically, 1D distance fields are much faster to build and query than a 2D or 3D silhouette edge graph. Additional acceleration is provided by using a binary tree to query the distance fields; at each node in the binary tree we can store the minimum and maximum distances of each subtree. Rays can be cast through the binary tree to identify the boundaries of the clipped silhouette, and determine which maxima give the minimal offset. The smallest value from each of the four distance fields may give the global minimal offset. If no silhouette could be found in any direction (e.g., the silhouette intersects the viewport boundary), no candidate line is returned; this can cause Algorithm 1 to position the candidate line on the base line, according to certain embodiments of the invention.

Referring back to FIG. 15, the geometric construction of candidate lines is illustrated. A goal is to compute the minimal translation of line (b) over the plane (p) so that the candidate lines can be placed without intersecting the model silhouette (gray shape). The final candidate lines ($\varphi_1$ and $\varphi_2$) may be moved by an additional padding distance beyond the nearest intersection ($x_1$, $x_2$).

Referring back to FIG. 17, 2D screen space offset calculations are shown. In the left image, due to the perspective projection to 2D screen space, base lines can rotate and change length as they are offset in world space. In the right image, offset computation using a distance field (red dashed line) clipped to the extension and base lines (red solid line) is shown.

Referring back to FIG. 18, four distance fields to approximate the silhouette of the model can be computed. One distance field is computed for each of the four viewport boundaries. In the left image, the distance field from the left boundary is shown. In the right image, all four distance fields approximate the model's silhouette are shown.

Finding the Final Dimension Line

A goal of this algorithm step (compute Winner in Algorithm 1) is to select a final dimension line from among the candidate lines computed in the previous subsection, according to certain embodiments of the invention.

We can evaluate each candidate line using the following scoring function, S, and select the candidate with the highest score. Intuitively this function may primarily favor the candidate line nearest to its base line, using screen candidate line length as a tie-breaker. Preferred alignment, temporal damping, and plane preference are relatively minor terms that provide tie-break stability to the system.

$$S = \lambda_1 \text{Dist} + \lambda_2 \text{LenCandidate} + \lambda_3 \text{SSAlign} + \lambda_4 \text{Damp} + \lambda_5 \text{Intersect} + \lambda_6 \text{Plane} \quad (1)$$

In some embodiments, to convert all of the penalty functions into the same unit, we can multiply by handleSpacing (=30 pixels) where necessary. The components are described here:

Dist ($\lambda_1 = -1$) measures the distance of the middle point on the baseline to the middle point on the candidate line in pixels. This is motivated by design principles 1, 2 and 5 (e.g., see above).

LenCandidate ($\lambda_2 = 0.02$) measures the length of the candidate line in screen space. Lines foreshortened because of perspective have reduced importance (see design principle 10).

SSAlign ($\lambda_3 = 3 \times \text{handleSpacing}$) computes how close the screen space extension line direction, $d_1$, is to the preferred alignment direction, $d_2$ (given by the property alignment). If no preferred alignment is specified SSAlign=0, else SSAlign=$d_1$.dot($d_2$); $d_1$, $d_2$ are normalized. In the latter case, the more stable positioning during navigation may correspond to design principle 9.

Figure 19:
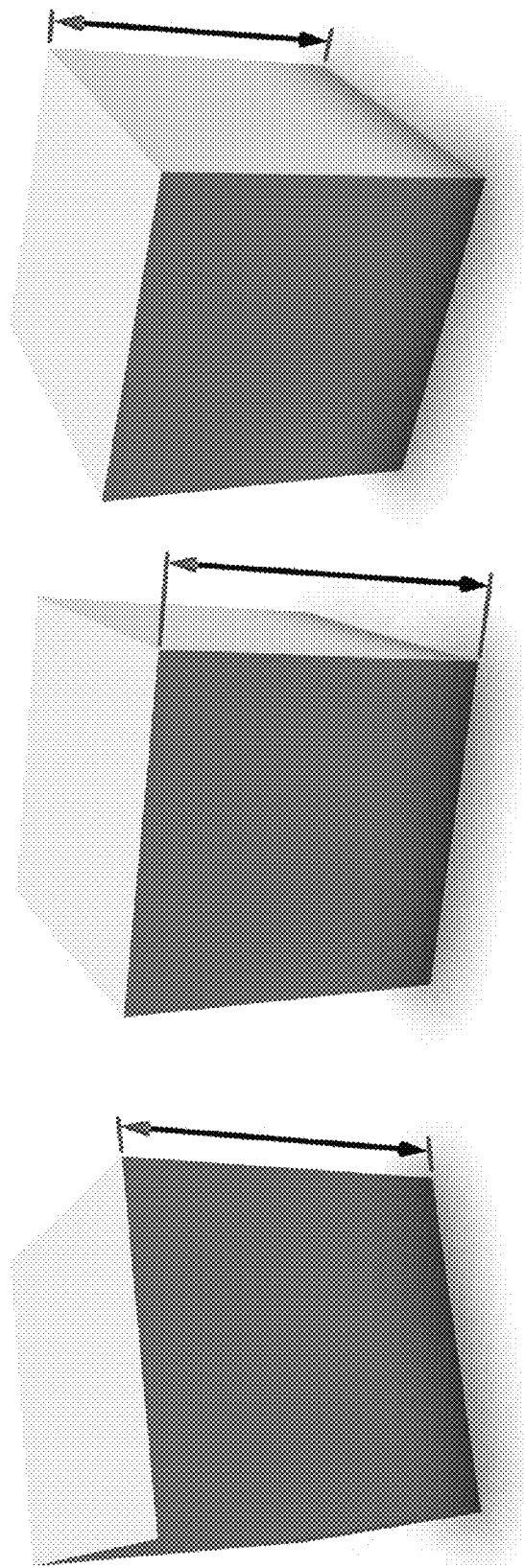
FIG. 19 illustrates a damping effect, according to certain embodiments.

Damp ($\lambda_4 = 0.5 \times \text{handleSpacing}$) tries to enforce consistency in the candidate selection and to avoid jumping dimension lines during navigation (see design principle 9). If the candidate line is the same as the final line in the last frame Damp returns 1 and 0 otherwise. This is shown, e.g., in FIG. 19, showing how the dimension line jumps as the cube is rotated clockwise.

Intersect ($\lambda_5 = -\text{handleSpacing}$) returns 1 if the candidate line or its extension line cross a previously placed dimension line or extension line, and 0 otherwise. This is a small term to avoid, rather than exclude, intersecting lines (design principle 7).

Plane ($\lambda_6 = 3 \times \text{handleSpacing}$) returns 0 if there is no plane associated to the candidate line or its plane is from the billboard offset behavior, 0.5 if the plane faces away from the camera, or 1 if the plane faces towards the camera.

Note that, when using the base lines as candidate lines (after a failure to find better candidate lines), the scoring function may favor longer lines with the specified preferred alignment; the other terms may be irrelevant.

Referring back to FIG. 19 from the left most figure to the right most figure, as a base line moves away from a silhouette, the effect of damping is to give a small amount of elasticity, meaning the line does not immediately move to the new position when the silhouette changes (middle). This gives the user a chance to anticipate the movement. Without damping we snap from (left) to (right).

Advanced Dimension Line Placement

Figure 20:
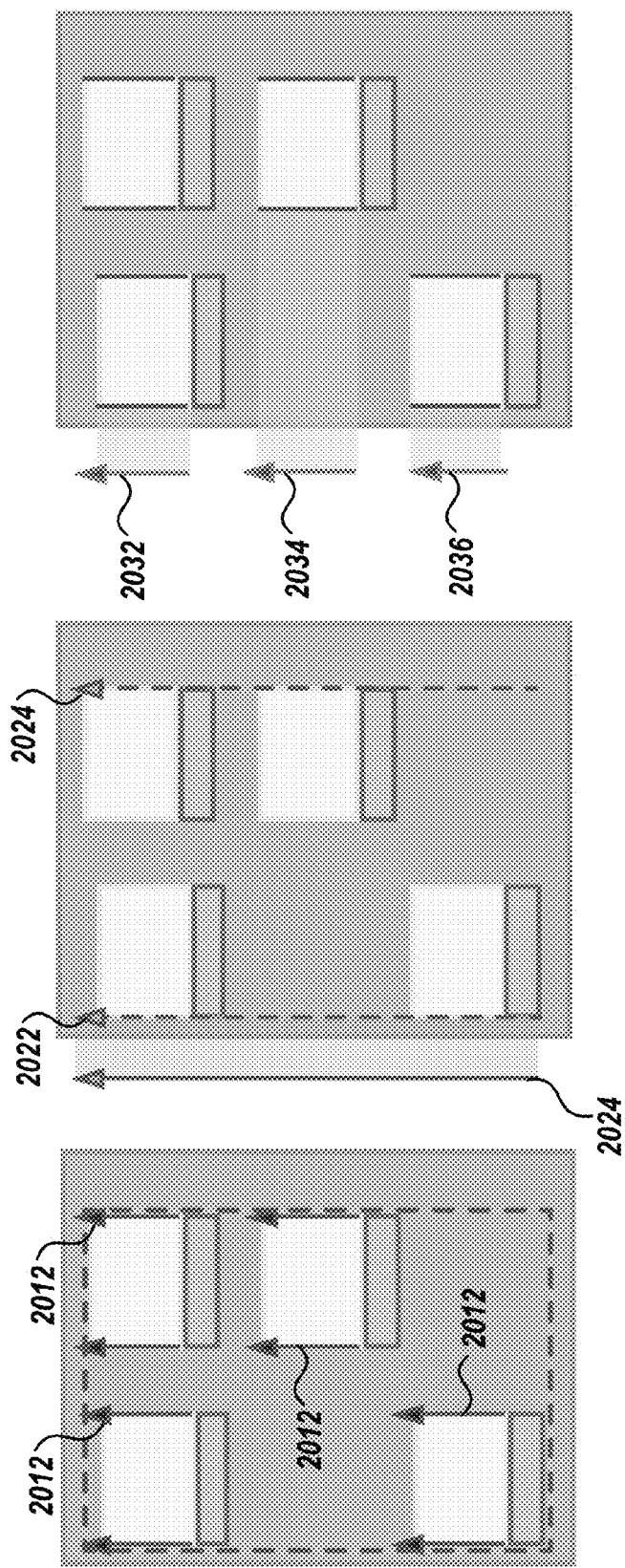
FIG. 20 illustrates aspects of using chained dimension lines to align final lines from the same parameter, according to certain embodiments.

In this section, we discuss two advanced cases of dimension line placement: placing dimension lines for multiple scopes with the same name, and grouping dimension lines with the same orientation and plane together. Such lines are called chained dimension lines, as illustrated in FIG. 20.

Multi-Scope:

If a model contains multiple scopes with the same name, all of these scopes can be associated with the same parameter. It is therefore sufficient to place a single dimension line to control the one parameter that is shared by multiple scopes. In this case, getBaseLines in Algorithm 1 returns all base lines for all involved scopes with the same name, according to certain embodiments of the invention.

Chained Dimension Lines:

Chained dimension lines can indicate that several measurements are collinear and contiguous in world space. In certain embodiments of our interactive system we do not demand that the chained lines are contiguous, but use the style to indicate repeated dimensions. The author specifies if a parameter is chained. The advantages of chained dimension lines are that they suggest to the user that one parameter can affect multiple scopes in a row or grid; such grids are typical on building facades. Another benefit is that we perform fewer computeWithSilhouette calls (see Silhouette Line Placement), improving speed for large grids of scopes.

Some challenges of chained dimension line computation are that we first need to identify which base lines lie in the same plane. Further, after projection onto the final chain line, the chained lines may intersect, either between themselves or with existing lines. Therefore, we can select a non-intersecting subset of base lines for projection. The algorithm proceeds in the following steps.

First, given the set of base lines 2012 for a parameter (see FIG. 20, left), we may cluster these base lines according to i) orientation, and ii) the planes that they lie in. Given each such cluster, we find an oriented bounding rectangle of all base lines in the plane associated with the cluster (see FIG. 20, left, dashed lines). Then we can use two sides of these oriented bounding rectangles as the new candidate chain base lines (see FIG. 20, middle, dashed lines), and proceed using Algorithm 1 to compute a final chain line (see FIG. 20, middle, solid line).

The base lines within the cluster associated with the final chain line are then projected onto the final chain line (see FIG. 20, right). In some cases, we should account for intersections, between the lines in the cluster, and, in the case that the final chain line is a guide line, existing final lines from other parameters. For all base lines in the cluster associated with the winning candidate chain line, we can project them onto the final chain line in world space. If the space is already occupied, the line can be rejected. In case of an intersection, the closest base line may have priority.

We can run the clustering algorithm as a pre-processing step, and when the model changes. The combination of chained dimension lines and snap lines can produce a compact layout when working with tiled or repeating elements; facades are a typical example, as shown in FIG. 21.

Referring to FIG. 20, chained dimension lines (2032-2036) align final lines from the same parameter. The alignment is implemented by finding several candidate chain base lines (2022-2024), and then finding the most suitable, the final chain line (2026). Final dimension lines are projected onto this final chain line.

Referring to FIG. 21, a facade with 3 parameters dimensioned using chain lines are shown: windowsill height and window height/width. The width parameter is multiplied by a random value to obtain various window sizes, so an indirect chain dimension line is used, indicated by dashed gray dimension lines (top). Note how the snap guide on the left supports two parameters on a single line.

Object Plane Locations

Object planes can provide organization to lines with slip=object. Previously, complex models under extreme perspective may have created a "forest" of lines, that were widely spread, were untidy, and difficult to interpret. Certain embodiments of the invention pre-compute a smaller number of object planes from the base line positions. Placing the candidate lines on these planes can result in a significantly tidier layout.

The set of object planes, $P_{object}$, in Algorithm 1 is comprised of front and back facing partially-bounded planes that cover most of the screen. In some embodiments, to compute the planes, we first may project all base lines onto the object's ground plane (i.e. the xz-plane of its OBB). Second, we may compute the 2D convex hull around the resulting points and lines on the ground plane. Third, as illustrated in FIG. 22, the hull can be extruded to the height of the object and each face of the resulting geometry is converted into a plane. The forward facing planes may be preferred for dimension line placement (see, e.g., Finding the Final Dimension Line). Planes with a normal within 0.1 radians of perpendicular to the camera's view direction can be ignored. We use this distinction between front and back facing planes because we observe that when the front facing planes were full of lines, the back facing planes often have remaining space.

Referring to FIG. 22, to compute the set of object planes, we can take the 2D convex hull of all base lines projected onto the ground plane (left, 2205). This is extruded to the height of the object. Forward facing planes, are bounded by their neighbors (2210-2230), as are rear facing planes (2240-2270).

Figure 29:
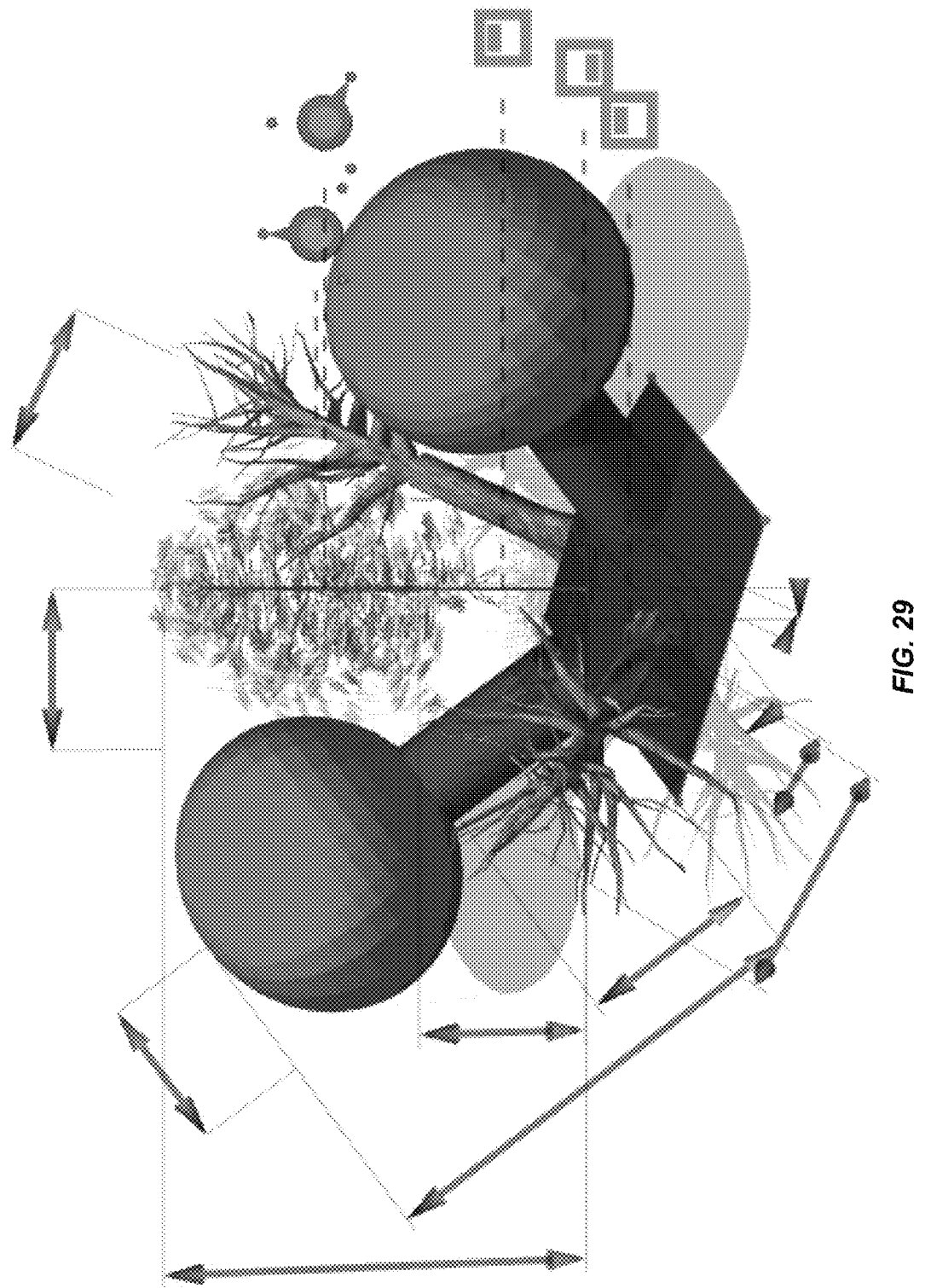
FIG. 29 illustrates how it can be difficult to understand the behavior of many dimension lines in certain figures.
Figure 34:
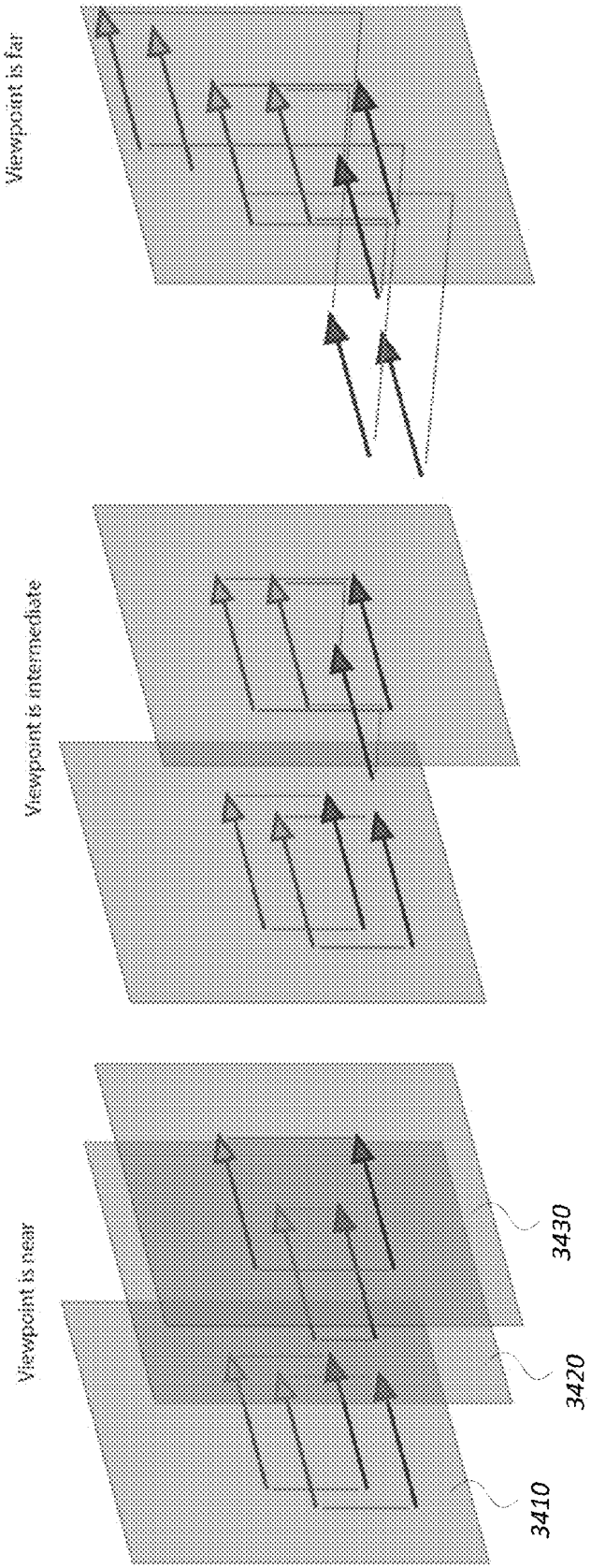
FIG. 34 shows an alternative process for finding a set of object planes, according to certain embodiments.

FIG. 34 shows an alternative process for finding a set of object planes, according to certain embodiments. This process produces fewer planes as the viewpoint recedes, resulting in a tidier layout of the dimension lines. Note that in contrast to the description above, this algorithm recalculates $P_{object}$ per-frame. Plane clusters are found by grouping all the potential slip planes (from getScopPlanes in Algorithm 1) for all base lines on the model, using their normal direction. Each cluster can contain planes with a similar normal. For each viewpoint and base line, we select the plane cluster that is most parallel to the view-plane. Some, or all, of the planes can then be merged depending on the viewpoint distance. A single plane from the merged cluster is placed in $P_{object}$: the next nearest to the view point from the base line. As shown in FIG. 29, as the user's viewpoint recedes, the planes are merged in the cluster. As the planes are merged, we keep the plane nearest the camera. For example, in FIG. 34, left, there are 3 slip planes (3410-3430). When the viewpoint moves away a little, planes that are close to each other merge (above, middle), and $P_{object}$ contains the next nearest plane to the viewpoint. When the user zooms out a long way (above, right) there is only one plane in the cluster, and all base dimension lines are projected into it.

Algorithm Details

In this section, we discuss the details involved in combining the algorithms of the preceding sections.

Parameter Order:

Design principle 6 (see Interactive Dimensioning Principles) states that the nesting should be computed with longer dimension lines further away from the object than shorter ones. Therefore, in some cases we sort the parameters by the average length of their base lines in world space. A special case can be chain lines; for these we compute the average world space length of all the parameter's base lines. In general, this gives a shorter length than that of the entire chain. Given this sorted list of parameters, we position dimension lines starting with the shortest first. Sorting by world space, rather than screen space length allows i) frame-to-frame positioning decisions to be consistent, and ii) pre-computation of this order. One intuitive advantage of this ordering is that shorter dimension lines fill irregularities in the silhouette better that long ones. Further, there is a higher chance of extension lines intersecting dimension lines if longer dimension lines are placed closer to the model silhouette.

Figure 23:
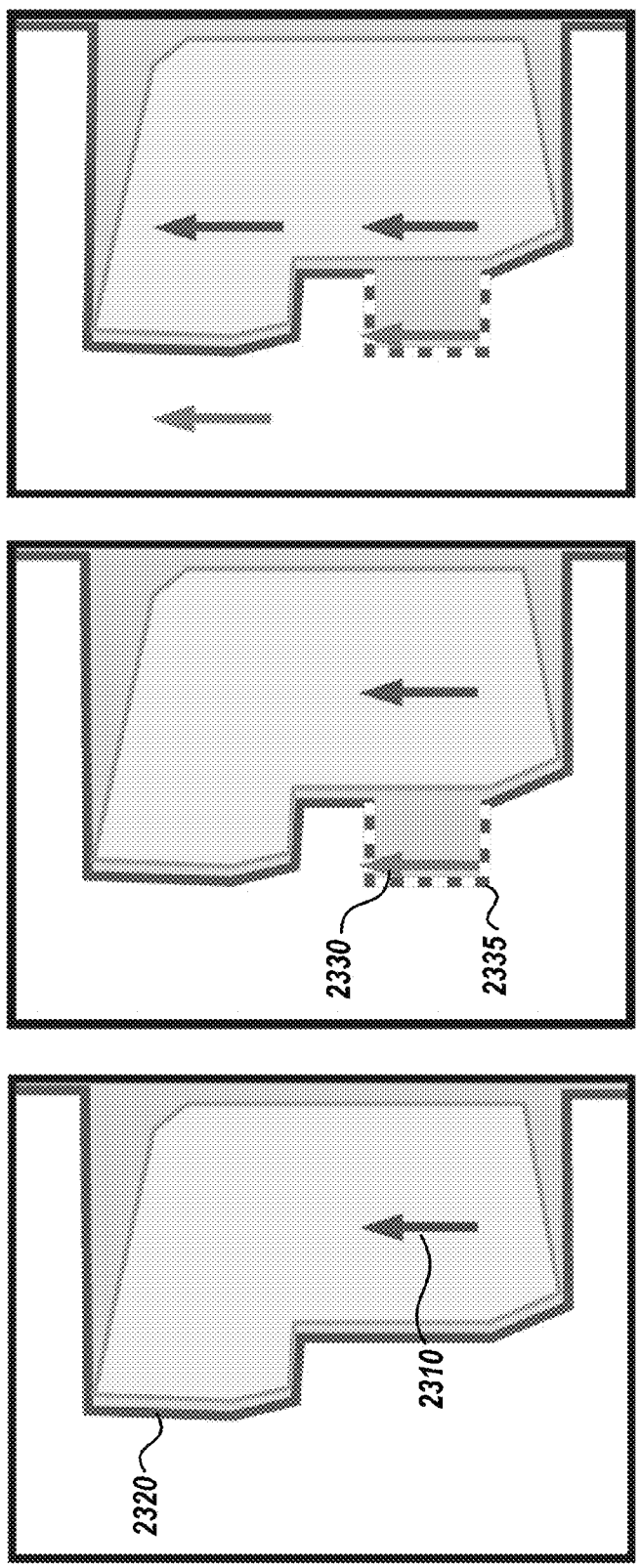
FIG. 23 the updating of a distance field as dimension lines are placed, according to certain embodiments.

Silhouette Updating:

As we iteratively add dimension lines to the current view, we update the silhouette of the model by modifying the distance fields, as shown in FIG. 23. Further, we can store a boolean value with each distance in the distance fields to indicate if the distance was modified due to a dimension line. This can be used to encourage dimension lines to not cross earlier final dimension lines or extension lines, via the Intersect penalty term (see Finding the Final Dimension Line).

Referring to FIG. 23 the left image shows a left distance field (2320) for a model, and a base line (2310). The middle image shows the distance field after positioning the candidate line (2330). The winning line sets the boolean flag for the region it has updated (2335). As shown in the right image, this allows final dimension lines to avoid one another.

Interactive Editing

The dynamic line placement can enable predictable and intuitive editing of parameters. It is natural for users to interactively edit models with dimension lines, as they are positioned close to the feature that they are manipulating without obscuring the model itself.

The arrows terminating dimension lines can be treated as handles which can be dragged by the user. Depending on the parameter type (as shown in FIG. 5), either one or both arrowheads are colored orange to indicate that they are a handle.

Indirect Handles:

So far, the examples above have assumed that the value of the parameter is always equal to the length of the dimension line. There are situations, however, in which the relationship between the dimension line length and the parameter value is complex or indirect. A typical example is the parameter Number_of_Floors which controls the height of a house, as shown, for example, in FIGS. 5-6. Here the number of floors is an integer, while the scope size it is attached to is measured in meters (and is a function of floor height, spacing between floors, and number of floors). Another example is a parameter that drives the total floor area of a building, when not all floors have the same area (see FIG. 24).

Figure 24:
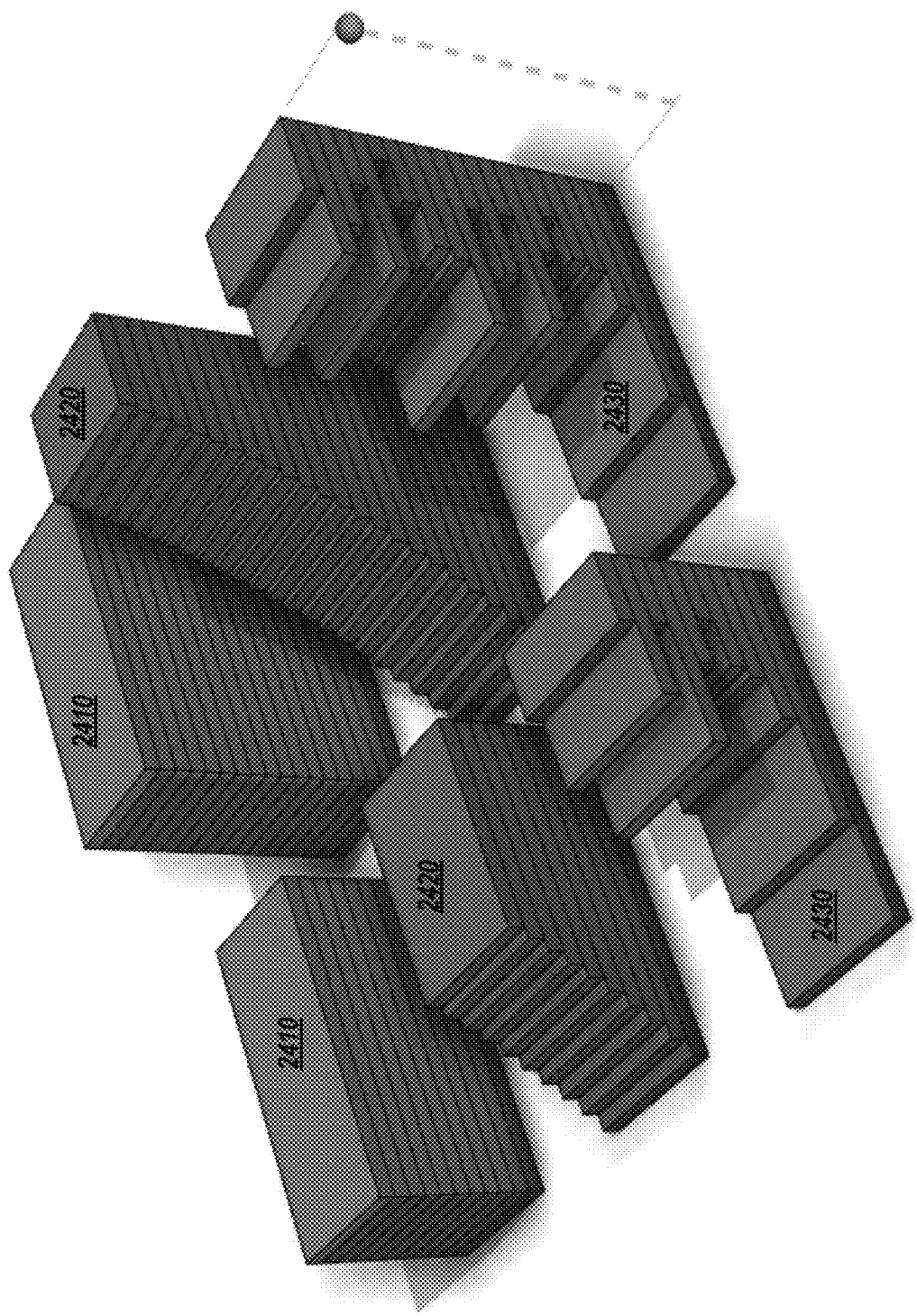
FIG. 24 illustrates the positioning of an indirect dimension line to control a total floor area, according to certain embodiments.

In FIG. 24, the buildings are parameterized by total floor area. Positioning the dimension line as shown controls this parameter. In the red case (2410) there is a linear relationship between the line and parameter value. In the green (2430) and blue cases (2420) there is a non-linear relationship. Indirect handles provide an appropriate line length and editing behavior. Note the stippled dimension line, and author specified spherical decoration.

In a static model, a scope specifies the position, orientation, and length of a base line. During interactive dragging of a handle, the behavior of direct and indirect handles can differ. Direct handles can change size without waiting for the delayed asynchronous recomputation of the model. The size of indirect handles changes when the model is recomputed. As the user drags an indirect handle, the model is regenerated, and the number of scopes, and their positions, may change; a typical case is when editing the parameter Floor Height using a dimension line in the center of the building. In this situation we use the scope, with the same name, that is nearest to the position of the handle when the user started dragging, to position the dragged dimension line.

Figure 30:
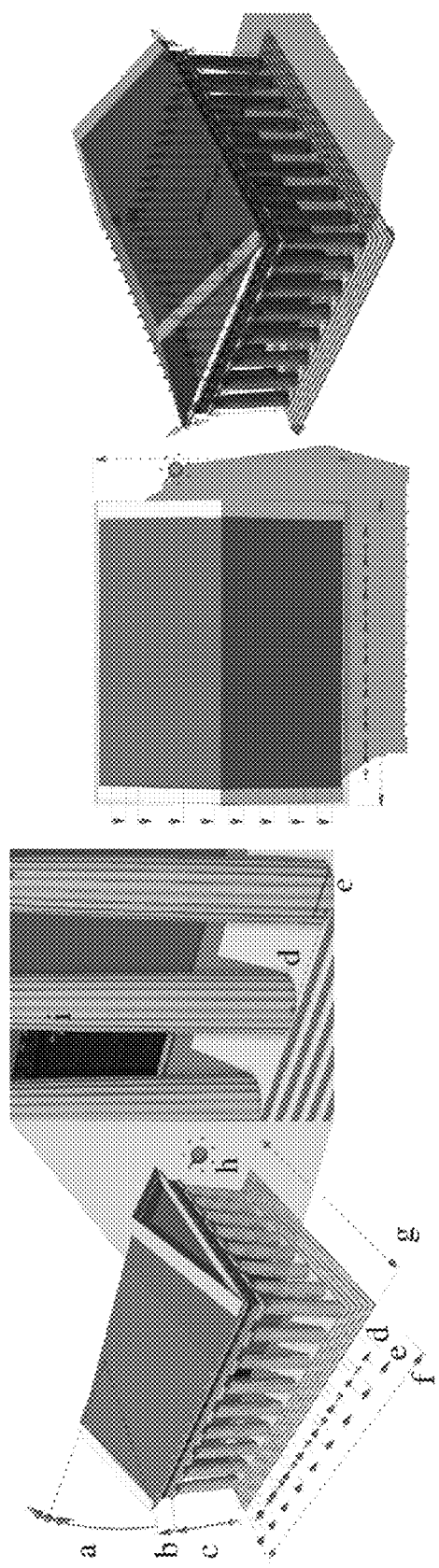
FIG. 30 illustrates the difficulty of positioning dimension lines in certain models.

We indicate indirect parameters to users by stippling the dimension line. Indirect handles also have applications to situations where the parameter specifies the desired spacing between repeating elements, and the parametric model rounds this value to ensure an integer number of elements. An example is shown in FIG. 30 by the parameter Column Spacing of the Parthenon model (encoded using a floating dimension in the repeat operation in CGAShape.

Other Handle Types:

In some embodiments, the system includes other parameter types and representations. Rotational handles control a floating point value representing an angle, these are rendered as in FIG. 30, with optional distance field queries to move them outside the model. Boolean handles represent a binary parameter. Range handles allow the user to specify one discrete option from several. Color handles allow users to specify a color parameter. Boolean, range (FIG. 30) and color handles are placed similarly to dimension lines.

Figure 25:
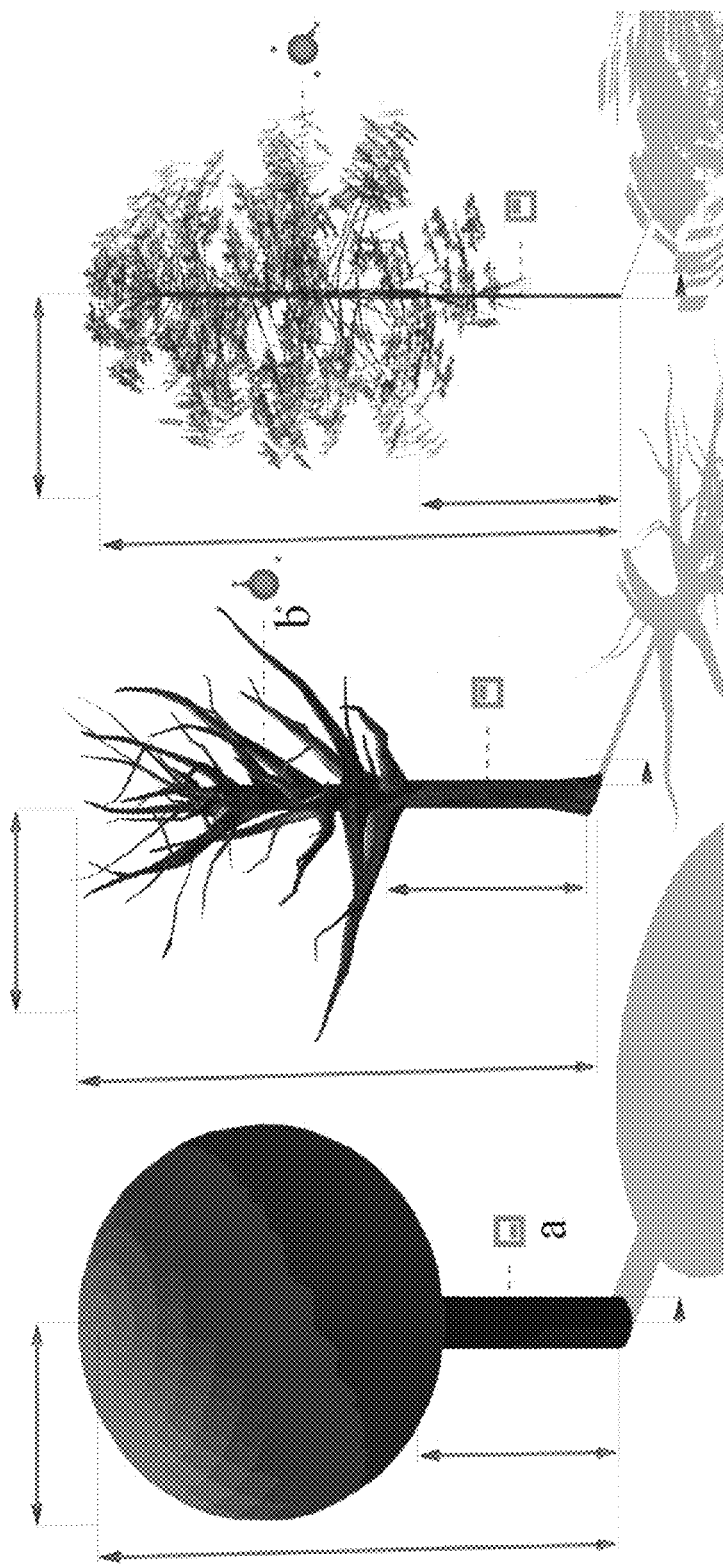
FIG. 25 illustrates how a boolean handle is used to switch between a schematic and a realistic tree, according to certain embodiments of the invention.
Figure 26A:
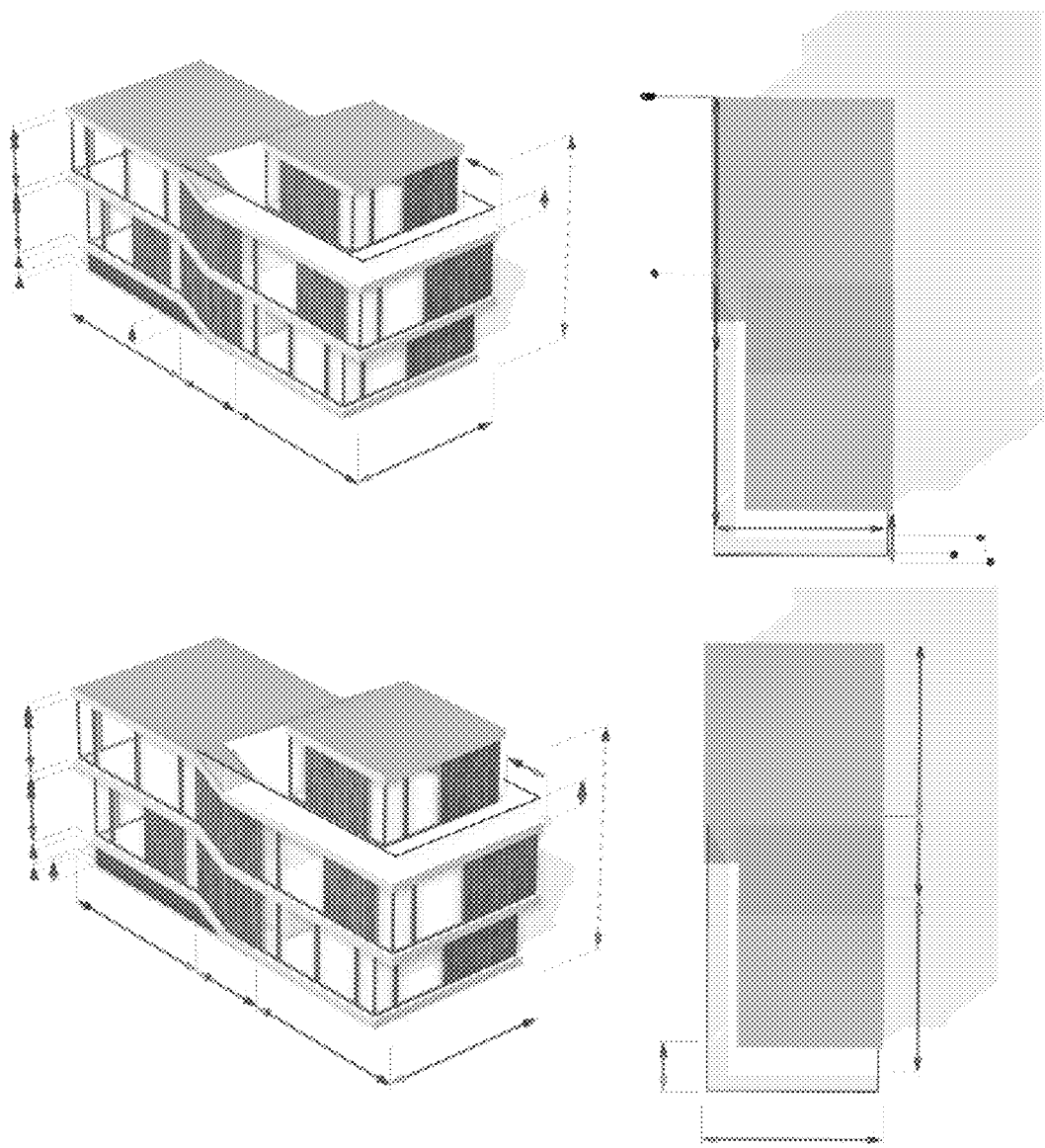
Figure 26B:
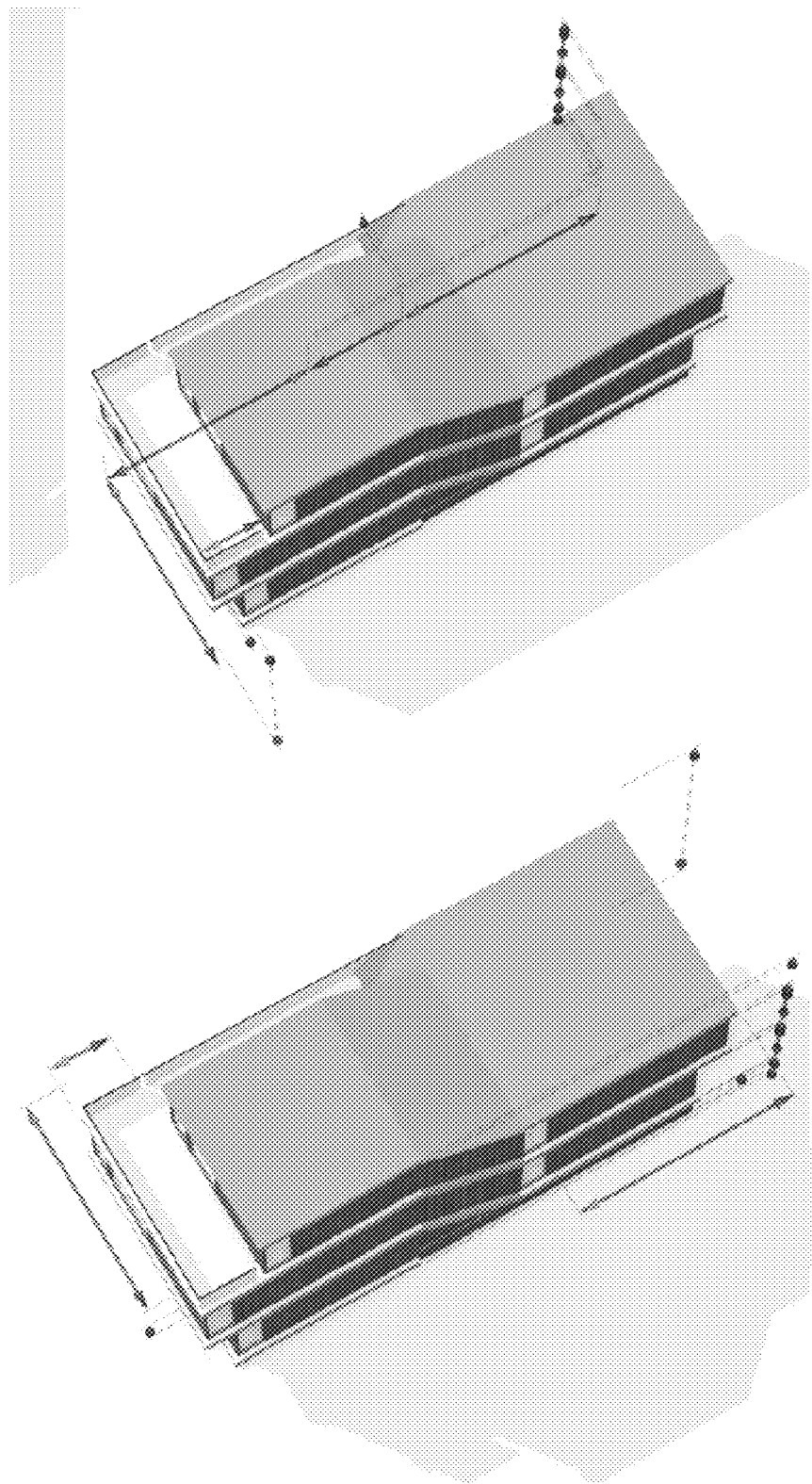
Figure 26C:
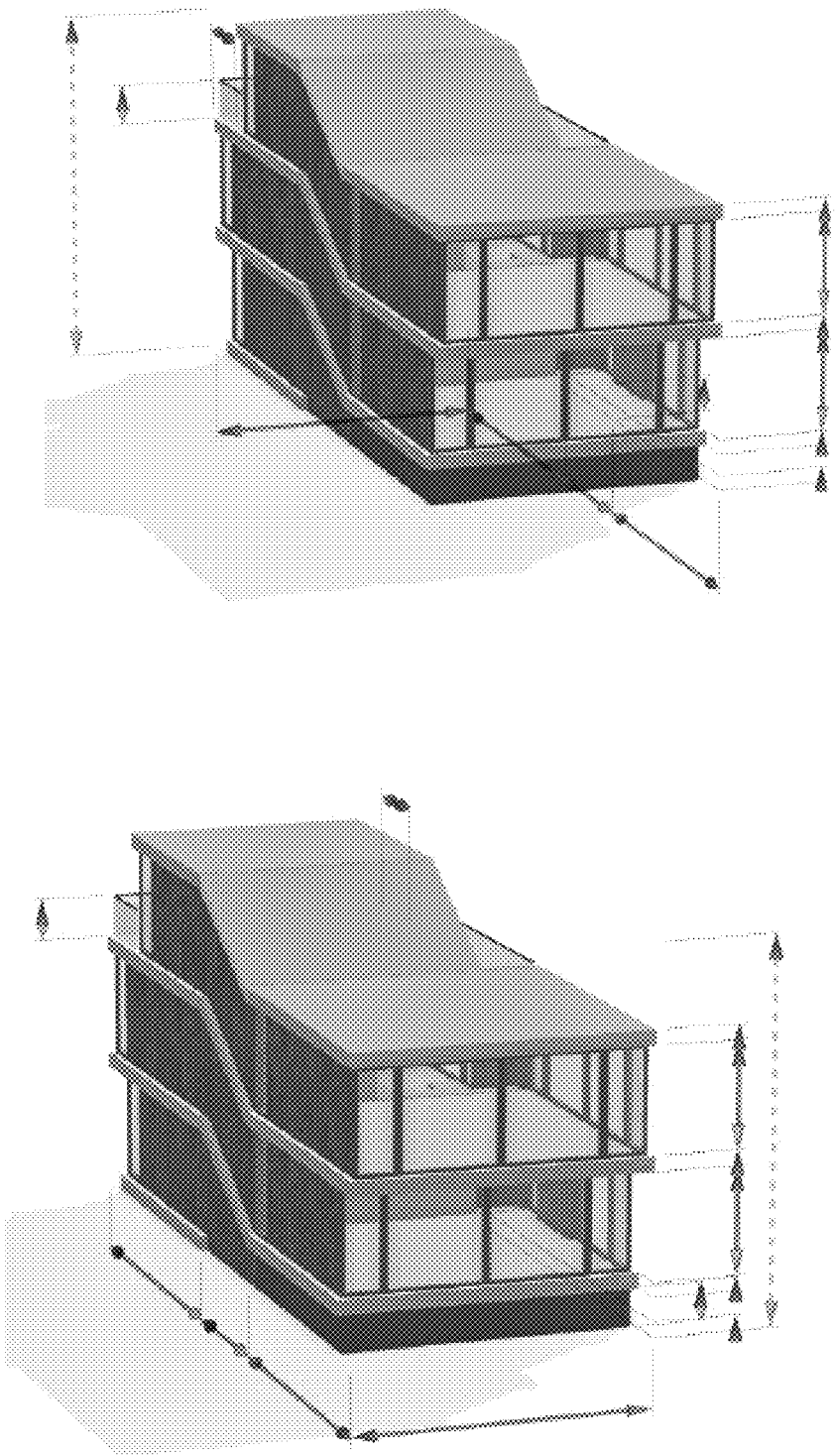

Referring to FIG. 25, the boolean handle (a) is used to switch between a schematic (left) and a realistic tree (middle & right). When the scope containing the realistic tree is created, a range handle (middle, b) is shown, which can be used to change the tree type (right).

Rendering Handles:

We use a number of techniques to improve the usability of the handles. Visibility: Typically dimension lines that are short in screen space represent less important features. The author can specify a minimum line screen length in pixels; below this length, lines and handles are not shown. Handles are also hidden if they are angled towards the view location. A modifier key shows all hidden handles. Hover behavior: If a user hovers over a handle, it displays its current value and increases in size to emphasize that it is editable. Animation: When several handles move from one location to another as the view rotates, it can be hard for a user to follow them. Therefore we animate between handle positions, visibility, and size. Animation also reduces jitter in handle locations.

Extension Lines:

For each dimension line we can draw extension lines from the top and bottom of the handle to the corresponding base line, according to certain embodiments of the invention. If necessary the lines are bent at the associated plane, as shown in FIG. 21. If both the top and bottom extension lines are collinear with an existing dimension line, they are offset slightly in a perpendicular direction for clarity, this effect is visible on the sail-width handle of FIG. 28.

Figure 32:
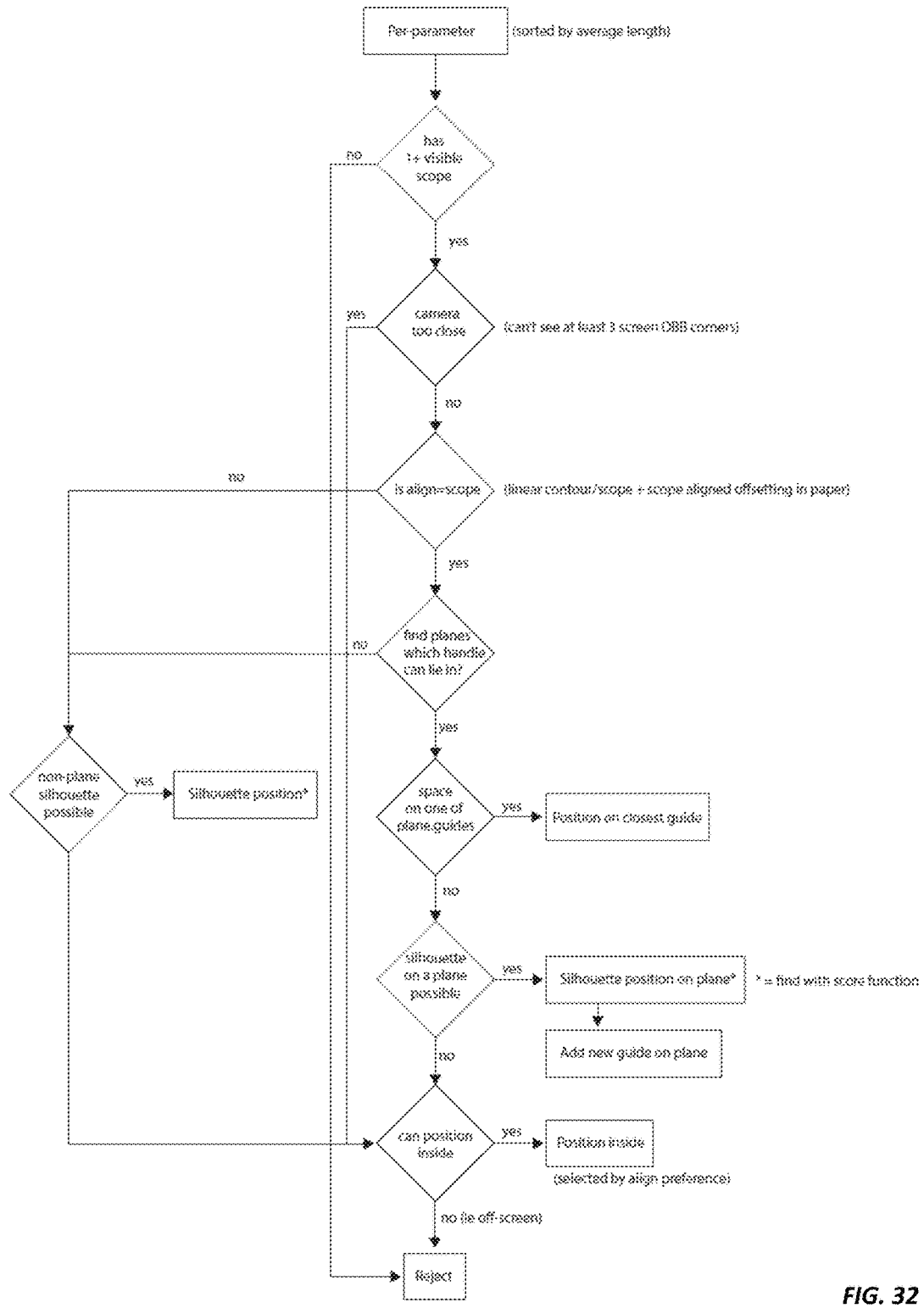
FIG. 32 shows aspects of an alternative method for placing dimension lines on a parametric model, according to certain embodiments
Figure 33:
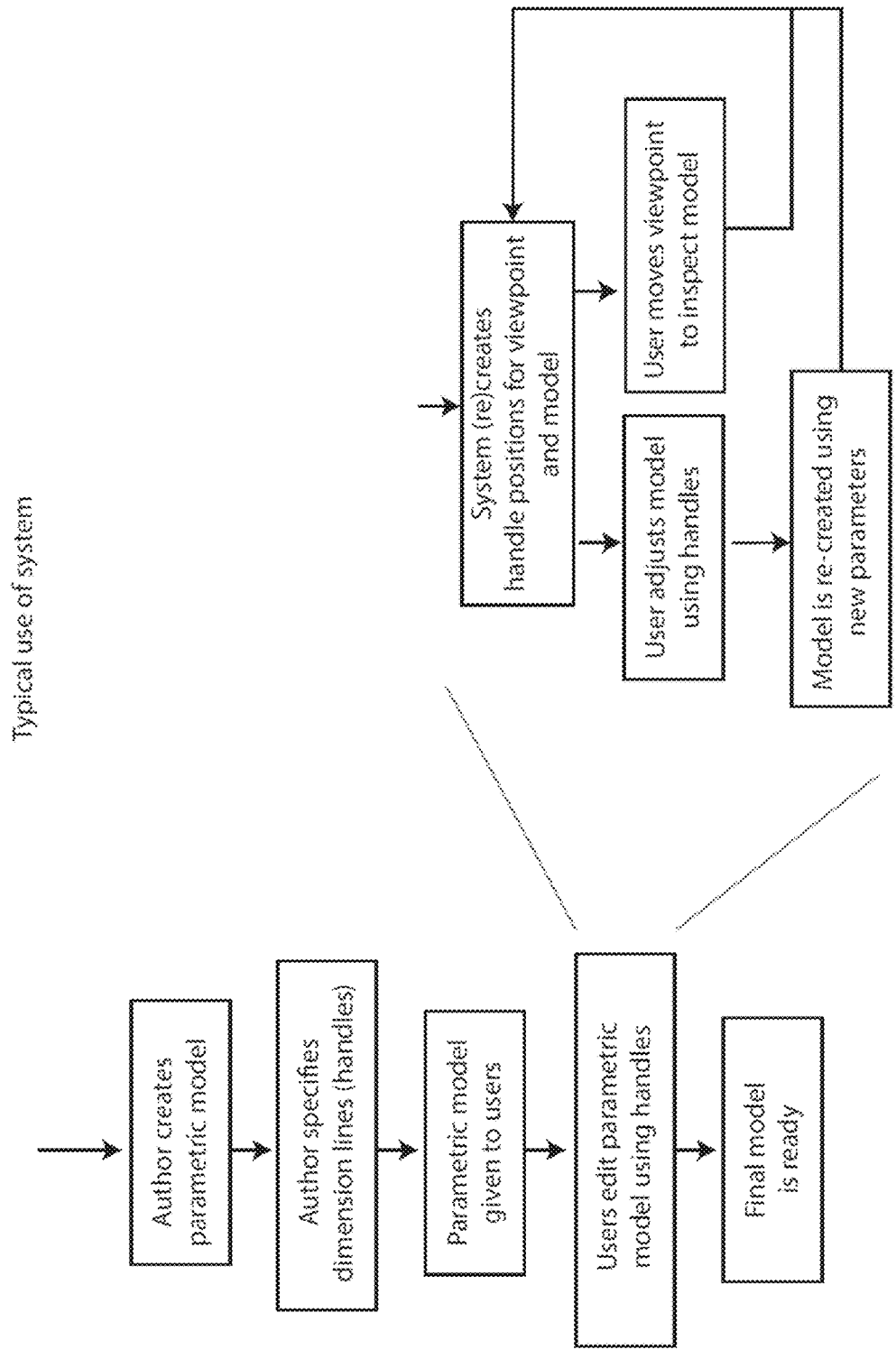
FIG. 33 depicts an example of a typical use of the systems described herein, according to certain embodiments.

FIG. 32 shows aspects of an alternative method for placing dimension lines on a parametric model, according to certain embodiments. FIG. 33 depicts an example of a typical use of the systems described herein, according to certain embodiments.

Results for Exemplary Embodiments

Some embodiments of the systems described herein were evaluated on a number of parametric models (see, e.g., FIGS. 26-31). A summary of the results are shown in Table 1. These models give a range of complexity ($10^3$ to $10^5$ polygons), domains (architecture, engineering and botany) and number of parameters (6-23). Specifying the handles took between 10 and 50 minutes; the majority of this time is spent finding appropriate scopes for each handle. Our test system was a late 2012 Core i7 iMac with a GeForce GTX 680MX mobile graphics card, displaying a viewport resolution of 1000×1000. Parametric models create a variety of geometry and scopes, therefore we chose one typical parameterization for each model. The total number of final handles shown is typically the same as the number of parameters, with two caveats. Firstly, this counts repeated handles for the same parameter on a chain line only once. For example, the Candler building's Window_Height parameter has 16 dimension lines on a single chain line. Secondly, the number ignores the effects of handles attached to occluded scopes and those handles whose scopes are not created in this particular parameterization. In the Boat model, for example, each mast has a Mast_Height parameter; some of which are only visible on larger parameterizations of the Boat.

TABLE 1

EVALUATING PARAMETRIC MODELS

| Name | FIG. | Poly count | Params | base lines (in clusters) | Num clusters | Pre-process | GPU fps (no handles) | CPU impl | GPU impl |
|---|---|---|---|---|---|---|---|---|---|
| Candler | 31 | 45366 | 6 | 2260 (2260) | 47 | 87 | 66 (242) | 719 ms | 4 ms |
| Lever | 27 | 1178 | 7 | 45 (36) | 10 | <1 ms | 353 (955) | 3 ms | 1.4 ms |
| Helix House | 26a-e | 1495 | 13 | 210 (80) | 22 | <1 ms | 171 (944) | 11 ms | 3.5 ms |
| Single Tree | 25 | 5610 | 6 | 15 (0) | 0 | <1 ms | 459 (1021) | <1 ms | <1 ms |
| Omni Tree | 29 | 29767 | 18 | 75 (0) | 0 | <1 ms | 192 (912) | 1 ms | 2 ms |
| Parthenon | 30 | 132263 | 10 | 266 (240) | 32 | 2 ms | 129 (392) | 1122 ms | 3 ms |
| Boat | 28 | 58214 | 23 | 37 (36) | 24 | 2 ms | 147 (681) | 364 ms | 3 ms |

Referring to Table 1, for each model we include a number of statistics, including the total number of base lines, the number of those lines which are in a cluster, and the frames per second measured; separate timings for the CPU and GPU implementations are given.

The system performance is always real time (66 to 495 fps) when displaying handles. The GPU generated distance fields ensure that the number of base lines and distance queries, rather than the polygon count, determine the performance. To illustrate this, we implemented a CPU only solution that positioned the dimension lines by processing the object mesh; the results are shown in the right hand columns of Table. 1. The GPU computed distance fields give a speedup of up to 370× compared to the CPU algorithm, with the benefit increasing with model polygon count. Note that because of delayed buffer read-back, the GPU implementation timings do not include the time to create the distance fields. The chained lines ensure that even on large facades, the performance degradation was limited, with the byproduct of a superior user experience.

Our decision to use scopes as the mechanism to position dimension lines and other handles proved very flexible. As a side effect of this decision we are able to use other properties of the scopes; the size of the scope is used for indirect handles, while the orientation frame is necessary to align rotational handles. The set of scopes abstraction is also very adaptable to a wide range of parametric systems; indeed any system capable of outputting a named, oriented cuboid can use our dimension lines. In our implementation the scope name and behavior options are a text annotation next to each parameter definition. Furthermore, more than one subroutine can create scopes with a particular name, avoiding the rigid hierarchies of, for example, CGAShape. To hide a dimension line, all that is required is that the parametric model not create the scope to which the line is attached. Only three of our example models required additional scopes to be created, beyond those that the models' original authors created. In these cases it was possible to create intermediate or invisible scopes that had no effect on the geometry.

Referring to FIGS. 26a-e, parametric models illustrate a "Helix House." In each figure, the top view illustrates world space static dimension line positions, and the bottom view illustrates how embodiments of the invention create dimension lines that are visible, usable, and consistent with design principles at a wide range of angles and fields of view.

Because dimension lines are typically larger and have more positioning constraints than previously published label positioning systems, temporal coherence can be an issue from frame-to-frame. There is an inherent conflict between a good per-frame solution and a temporally good solution; this trade-off is made with the damping term, Damp, as discussed above.

Figure 31:
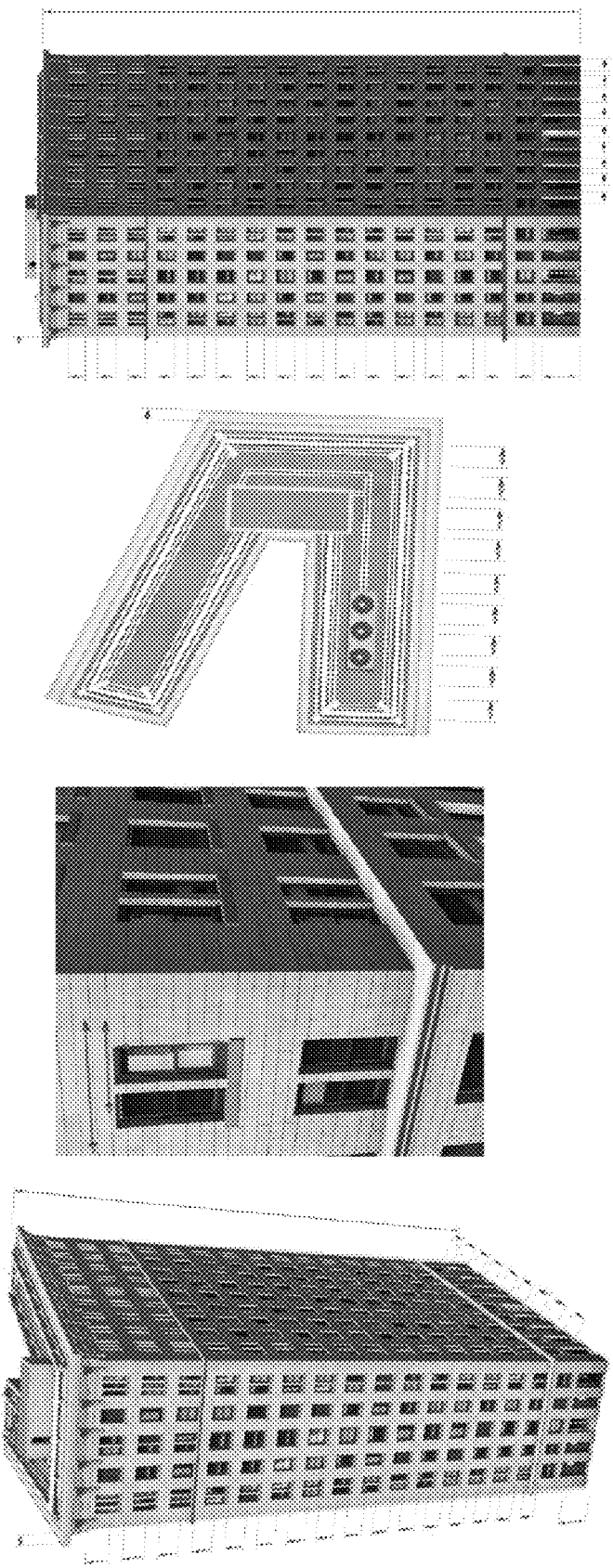
FIG. 31 illustrates aspects of creating and positioning dimension lines, according to certain embodiments.

Clearly identifying the direction and affected geometry makes it easier for novice users of parametric models. For example, novice users were confronted with the task of adjusting the size of the Candler building's roofline (FIG. 31). They were able to manipulate the Cornice_Overhang handle, despite not knowing the technical term cornice. The number and range of handles also gives a quick and easy indication of the ways in which a parametric model may be manipulated. This proved useful when discussing with users how much variety a particular parametric model is able to create. There was a limit to these parameter identification benefits: we created the Omni Tree model of FIG. 29 to explore a system in which many base lines with many orientations were positioned in a compact space, without the benefit of planes. The system is able to position the many conflicting handles at interactive speeds, but only experienced users can consistently identify which dimension lines controls which trees.

Figure 27:
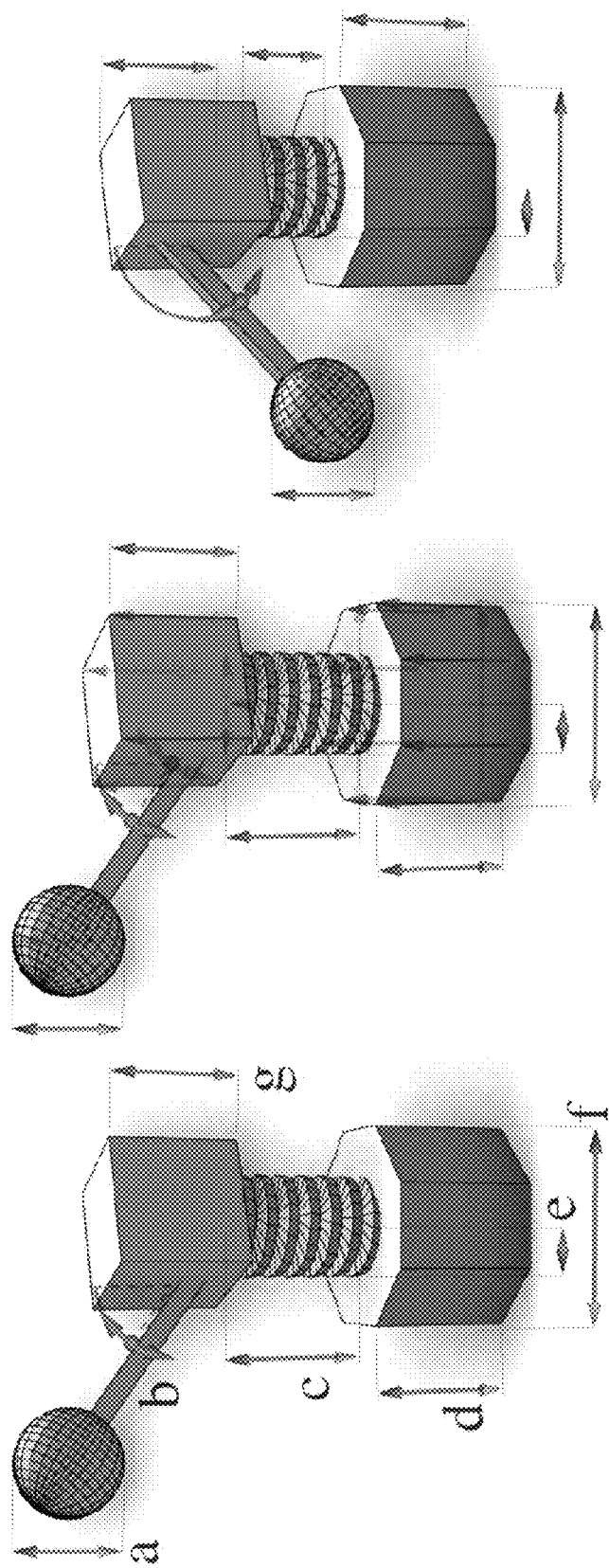
FIG. 27 illustrates how changing the configuration of the model causes the dimension lines to recalculate their positions, according to certain embodiments.

Referring to FIG. 27, a "Spring Lever" is shown. On the left: a) type=spherical diametric, slip=billboard; b) rotational, none; c) linear center, billboard; d&g) linear contour, scope; e) radial, billboard; f) diametric, billboard. In the middle: base lines (blue). On the right: changing the configuration of the model causes the dimension lines to recalculate their positions.

Figure 28:
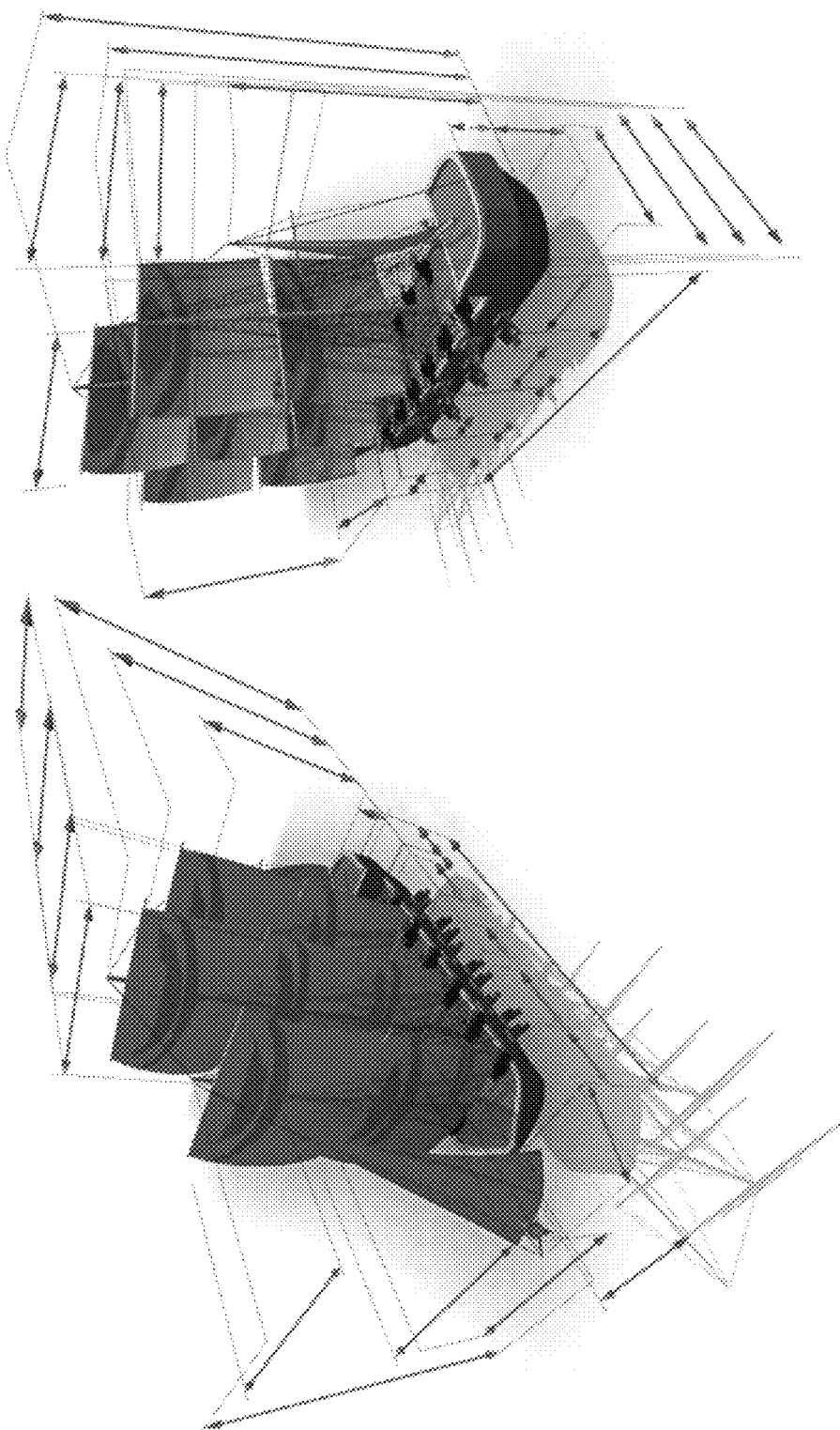
FIG. 28 illustrates how object planes allow a large number of parameters on a model of a galleon to remain clear and distinct, according to certain embodiments.

Referring to FIG. 28, a "Boat" is shown. The object planes allow the large number of parameters on this model of a galleon to remain clear and distinct.

Referring to FIG. 29, an "Omni Tree" is shown. When there are many dimension lines it is difficult to understand their behavior. Here 3 repeated sets of parameters from FIG. 18 create 5 different trees.

Referring to FIG. 30, an image of Parthenon, Athens, Greece is shown. On the left: as we zoom into the model, it becomes impossible to position dimension lines outside. We see that dimension lines d (column spacing) and e (column radius) are positioned on their base lines. In addition, short lines with a minimum display length (i) become visible. Also of note are the three chained dimension lines (def). Near the right, an orthographic top view is shown. On the far right, base line positions are shown.

Referring to FIG. 31, the "Candler Building, Georgia, USA" is shown. On the left: a three quarters perspective view. In the middle left, dimension lines are positioned inside when zoomed in. In the middle right, an orthographic top view is shown. On the right, an orthographic side view is shown.

CONCLUSIONS

Embodiments of the invention relate to a system for the interactive positioning of dimension lines. We give a set of design principles for interactive dimensioning and provide an algorithmic framework incorporating these principles. We describe how an author can specify the interactive behavior of dimension lines. An algorithm uses this description to select the final dimension line positions from among candidate positions. Further, we describe multiple extensions, including chained dimension lines, indirect parameters, different handle types (e.g. boolean and rotational handles), and the use of dimension lines for interactive editing. We demonstrate that our framework provides interactive frame rates when editing architectural, botanical, and mechanical models.

It should be understood that any number of enhancements, modifications, and applications are possible, as would be appreciated by one of ordinary skill in the art. For instance, some embodiments may extend the use of the GPU to accelerate our algorithms further. Some embodiments may explore the applications of interactive dimension lines to touch screen devices and examine the use of dimension lines in image editing. Other implementations are anticipated.

Sample Embodiments of System Architectures

Figure 35:
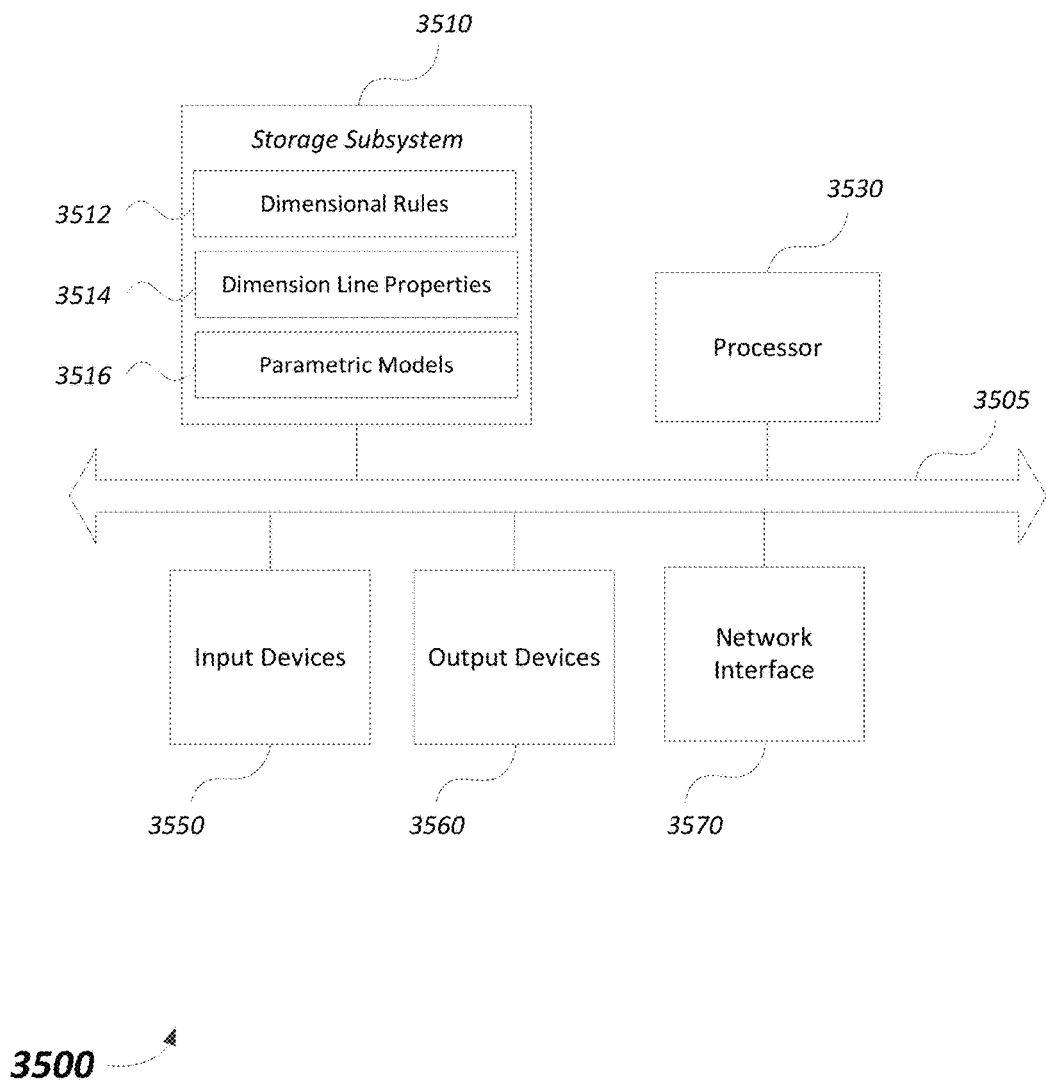
FIG. 35 illustrates a computer system for performing interactive dimensioning of parametric models, according to certain embodiments.

FIG. 35 illustrates a computer system 3500 for performing interactive dimensioning of parametric models, according to certain embodiments of the invention. The image processing, algorithms, and methods described herein can be implemented within a computer system such as computer system 3500 shown here. Computer system 3500 can be implemented as any of various computing devices, including, e.g., server(s), a desktop or laptop computer, tablet computer, smart phone, personal digital assistant (PDA), or any other type of computing device, not limited to any particular form factor. Computer system 3500 can include processing unit(s) 3530, storage subsystem 3510, input devices 3550 (e.g., keyboards, mice, touchscreens, etc.), output devices 3560 (e.g., displays, speakers, tactile output devices, etc.), network interface 3570 (e.g., RF, 4G, EDGE, WiFi, GPS, Ethernet, etc.), and bus 3505 to communicatively couple the various elements of system 3500 to one another.

Processing unit(s) 3530 can include a single processor, multi-core processor, or multiple processors and may execute instructions in hardware, firmware, or software, such as instructions stored in storage subsystem 3510. The storage subsystem 3510 can include various memory units such as a system memory, a read only memory (ROM), and permanent storage device(s) (e.g., magnetic, solid state, or optical media, flash memory, etc.). The ROM can store static data and instructions required by processing unit(s) 3530 and other modules of the system 3500. The system memory can store some or all of the instructions and data that the processor needs at runtime.

In some embodiments, storage subsystem 3510 can store one or more of data or software programs to be executed or controlled by processing unit(s) 3530, such as interactive dimensioning rules data 3512, dimension line properties data 3514, or parametric model data 3516, as further described above. As mentioned, "software" can refer to sequences of instructions that, when executed by processing unit(s) 3530, cause computer system 3500 to perform certain operations of the software programs. The instructions can be stored as firmware residing in read only memory and/or applications stored in media storage that can be read into memory for processing by processing unit(s) 3530. Software can be implemented as a single program or a collection of separate programs and can be stored in non-volatile storage and copied in whole or in part to volatile working memory during program execution. From storage subsystem 3510, processing unit(s) 3530 can retrieve program instructions to execute in order to execute various operations (e.g., interpolations) described herein.

It will be appreciated that computer system 3500 is illustrative and that variations and modifications are possible. Computer system 3500 can have other capabilities not specifically described here in detail (e.g., GIS technologies). Further, while computer system 3500 is described with reference to particular blocks, it is to be understood that these blocks are defined for convenience of description and are not intended to imply a particular physical arrangement of component parts. Further, the blocks need not correspond to physically distinct components. Blocks can be configured to perform various operations, e.g., by programming a processor or providing appropriate control circuitry, and various blocks might or might not be reconfigurable depending on how the initial configuration is obtained. Embodiments of the present invention can be realized in a variety of apparatus including electronic devices implemented using any combination of circuitry and software.

Aspects of system 3500 may be implemented in many different configurations. In some embodiments, system 3500 may be configured as a distributed system where one or more components of system 3500 are distributed over one or more networks in the cloud (remote Internet servers).

Figure 36:
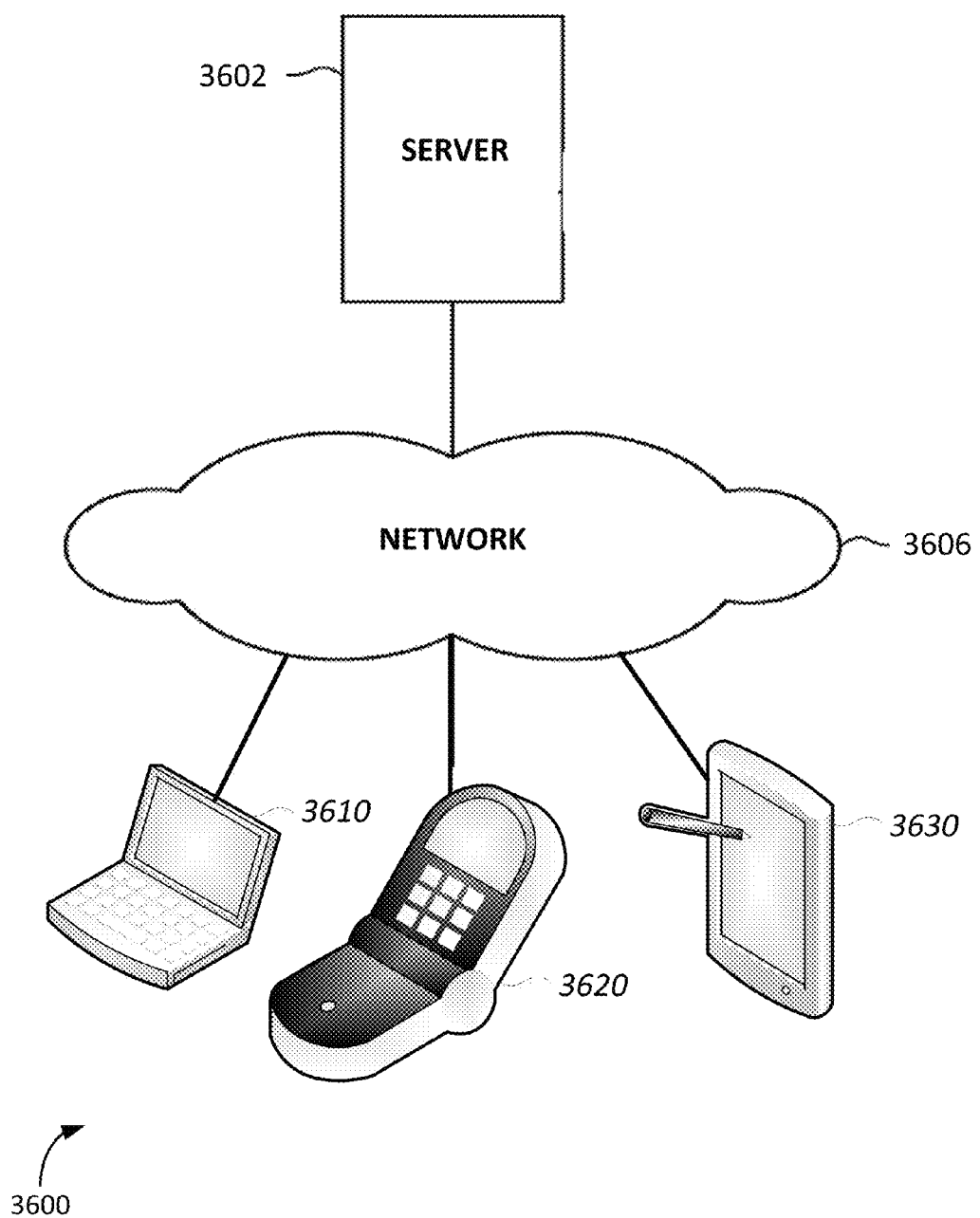
FIG. 36 depicts a simplified diagram of a distributed system for providing a system and method for interactive dimensioning of parametric models, according to certain embodiments.

FIG. 36 depicts a simplified diagram of a distributed system 3600 for providing a system and method for interactive dimensioning of parametric models, according to certain embodiments of the invention. In the embodiment depicted in FIG. 36, system 3600 is provided on a server 3602 that is communicatively coupled with one or more remote client devices 3610, 3620, 3630 via network 3606 (e.g., a cloud pipeline).

Network 3606 may include one or more communication networks, which could be the Internet (cloud), a local area network (LAN), a wide area network (WAN), a wireless or wired network, an Intranet, a private network, a public network, a switched network, or any other suitable communication network or combination thereof. Network 3606 may include many interconnected systems and communication links including but not restricted to hardwire links, optical links, satellite or other wireless communications links, wave propagation links, or any communication protocol. Various communication protocols may be used to facilitate communication of information via network 3606, including but not restricted to TCP/IP, HTTP protocols, extensible markup language (XML), wireless application protocol (WAP), protocols under development by industry standard organizations, vendor-specific protocols, customized protocols, and others as would be appreciated by one of ordinary skill in the art.

In the configuration depicted in FIG. 36, server 3602 is remotely located from client devices 3610, 3620, 3630. In some embodiments, server 3602 may perform the methods of determining (or interpolating) a population over a geographic area described herein. In some embodiments, the services provided by server 3602 may be offered as web-based or cloud services or under a Software as a Service (SaaS) model, as would be appreciated by one of ordinary skill in the art.

The cloud servers in one embodiment provide multiple instantiations of the processing program, or elements of the processing program, on one or more servers.

The various embodiments further can be implemented in a wide variety of operating environments, which in some cases can include one or more user computers, computing devices or processing devices, which can be used to operate any of a number of applications. User or client devices can include any of a number of general purpose personal computers, such as desktop or laptop computers running a standard operating system, as well as cellular, wireless and handheld devices running mobile software and capable of supporting a number of networking and messaging protocols. Such a system also can include a number of workstations running any of a variety of commercially available operating systems and other known applications for purposes such as development and database management. These devices also can include other electronic devices, such as dummy terminals, thin-clients, gaming systems and other devices capable of communicating via a network.

Most embodiments utilize at least one network that would be familiar to those skilled in the art for supporting communications using any of a variety of commercially available protocols, such as TCP/IP, UDP, OSI, FTP, UPnP, NFS, CIFS, and the like. The network can be, for example, a local area network, a wide-area network, a virtual private network, the Internet, an intranet, an extranet, a public switched telephone network, an infrared network, a wireless network, and any combination thereof.

In embodiments utilizing a network server, the network server can run any of a variety of server or mid-tier applications, including HTTP servers, FTP servers, CGI servers, data servers, Java servers, and business application servers. The server(s) also may be capable of executing programs or scripts in response to requests from user devices, such as by executing one or more applications that may be implemented as one or more scripts or programs written in any programming language, including but not limited to Java®, C, C# or C++, or any scripting language, such as Perl, Python or TCL, as well as combinations thereof. The server (s) may also include database servers, including without limitation those commercially available from Oracle®, Microsoft®, Sybase®° and IBM®.

The environment can include a variety of data stores and other memory and storage media as discussed above. These can reside in a variety of locations, such as on a storage medium local to (and/or resident in) one or more of the computers or remote from any or all of the computers across the network. In a particular set of embodiments, the information may reside in a storage-area network (SAN) familiar to those skilled in the art. Similarly, any necessary files for performing the functions attributed to the computers, servers or other network devices may be stored locally and/or remotely, as appropriate. Where a system includes computerized devices, each such device can include hardware elements that may be electrically coupled via a bus, the elements including, for example, at least one central processing unit (CPU), at least one input device (e.g., a mouse, keyboard, controller, touch screen or keypad), and at least one output device (e.g., a display device, printer or speaker). Such a system may also include one or more storage devices, such as disk drives, optical storage devices, and solid-state storage devices such as RAM or ROM, as well as removable media devices, memory cards, flash cards, etc.

Such devices also can include a computer-readable storage media reader, a communications device (e.g., a modem, a network card (wireless or wired), an infrared communication device, etc.), and working memory as described above. The computer-readable storage media reader can be connected with, or configured to receive, a non-transitory computer-readable storage medium, representing remote, local, fixed, and/or removable storage devices as well as storage media for temporarily and/or more permanently containing, storing, transmitting, and retrieving computer-readable information. The system and various devices also typically will include a number of software applications, modules, services or other elements located within at least one working memory device, including an operating system and application programs, such as a client application or browser. It should be appreciated that alternate embodiments may have numerous variations from that described above. For example, customized hardware might also be used and/or particular elements might be implemented in hardware, software (including portable software, such as applets) or both. Further, connection to other computing devices such as network input/output devices may be employed.

Non-transitory storage media and computer-readable storage media for containing code, or portions of code, can include any appropriate media known or used in the art such as, but not limited to, volatile and non-volatile, removable and non-removable media implemented in any method or technology for storage of information such as computer-readable instructions, data structures, program modules or other data, including RAM, ROM, Electrically Erasable Programmable Read-Only Memory (EEPROM), flash memory or other memory technology, CD-ROM, DVD or other optical storage, magnetic cassettes, magnetic tape, magnetic disk storage or other magnetic storage devices or any other medium which can be used to store the desired information and which can be accessed by a system device. Based on the disclosure and teachings provided herein, a person of ordinary skill in the art will appreciate other ways and/or methods to implement the various embodiments. However, computer-readable storage media does not include transitory media such as carrier waves or the like.

The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. The phrase "based on" should be understood to be open-ended, and not limiting in any way, and is intended to be interpreted or otherwise read as "based at least in part on," where appropriate. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

What is claimed is:

1. A computer-implemented method comprising:
   receiving image data corresponding to a three-dimensional (3D) parametric model;
   receiving a selection of a scope of the 3D model;
   receiving a selection of one or more base lines for the scope;
   determining a slip type for the scope;
   calculating planes of the scope based on:
      the one or more base lines; and
      the slip type;
   calculating candidate dimension lines based on:
      the calculated planes; and
      dimension line placement guidelines;
   selecting a dimension line of the candidate dimension lines based on dimension line placement rules; and
   displaying the selected dimension line adjacent to the scope, the selected dimension line corresponding to the selected one or more base lines,
   wherein the calculating planes of the 3D model, the calculating candidate dimension lines, and the selecting of the dimension line is performed and dynamically updated in real-time as the 3D model is rotated in a 3D environment.

2. The computer-implemented method of claim 1 wherein the scope further includes a type, the method further comprising:
   receiving a selection of the type of scope including one of:
      a linear contour type;
      a linear center type;
      a diametric type;
      a radial type;
      a spherical diametric type; and
      a spherical radial type,
      wherein the selection of the one or more base lines for the 3D model is based on the type of scope.

3. The computer-implemented method of claim 2 wherein the type includes an orientation, and wherein the selection of the one or more base lines for the 3D model is further based on the orientation of the type.

4. The computer-implemented method of claim 1 further comprising:
   determining when the scope is not visible in a current orientation of the 3D model; and
   removing the placed dimension line until the scope becomes visible.

5. The computer-implemented method of claim 1 further comprising:
   identifying an existing dimension line associated with the 3D model, wherein selecting the dimension line of the candidate dimension lines is further based on whether the existing dimension line is placed in a linear relationship with any of the candidate dimension lines.

6. The computer-implemented method of claim 1 wherein the slip type includes one of:
   a scope slip type causing the calculated planes to directly correspond to the scope;
   a billboard slip type causing the calculated planes to directly correspond to a current camera view of the 3D model; or
   an object slip type causing the calculated planes to directly correspond to dimensions of the 3D model.

7. The computer-implemented method of claim 1 wherein the dimension line placement guidelines include one or more of the following:
   dimension lines placed outside of 3D model where possible;
   dimension lines maintain a minimum defined distance from the 3D model and existing dimension lines;
   dimension lines located in planes which they apply or normal to a viewing direction of the 3D model;
   dimension lines are only shown for visible features;
   avoid placement of intersecting dimension lines; and
   group co-linear dimension lines where possible.

8. The computer-implemented method of claim 1 further comprising:
   displaying a user-manipulatable handle on the selected dimension line, the handle to dynamically control a length of the one or more base lines in real-time;
   receiving a user input corresponding to a movement of the handle; and
   manipulating the shape of the 3D model based on the movement of the handle.

9. A computer-implemented system comprising:
   one or more processors; and
   one or more non-transitory computer-readable storage mediums containing instructions configured to cause the one or more processors to perform operations including:
      receiving image data corresponding to a three-dimensional (3D) parametric model;
      receiving a selection of a scope of the 3D model;
      receiving a selection of one or more base lines for the scope;
      determining a slip type for the scope;
      calculating planes of the scope based on:
         the one or more base lines; and
         the slip type;
      calculating candidate dimension lines based on:
         the calculated planes; and
         dimension line placement guidelines;
      selecting a dimension line of the candidate dimension lines based on dimension line placement rules; and
      displaying the selected dimension line adjacent to the 3D parametric model, the selected dimension line corresponding to the selected one or more base lines,
      wherein the calculating planes of the 3D model, the calculating candidate dimension lines, and the selecting of the dimension line is performed and dynamically updated in real-time as the 3D model is rotated in a 3D environment.

10. The system of claim 9 wherein the scope further includes a type, the system further comprising instructions configured to cause the one or more processors to perform operations including:
    receiving a selection of the type of scope including one of:
       a linear contour type;

a linear center type;
a diametric type;
a radial type;
a spherical diametric type; and
a spherical radial type,
wherein the selection of the one or more base lines for the 3D model is based on the type of scope.

11. The system of claim 10 wherein the type includes an orientation, and wherein the selection of the one or more base lines for the 3D model is further based on the orientation of the type.

12. The system of claim 9 further comprising instructions configured to cause the one or more processors to perform operations including:
determining when the scope is not visible in a current orientation of the 3D model; and
removing the placed dimension line until the scope becomes visible.

13. The system of claim 9 further comprising instructions configured to cause the one or more processors to perform operations including:
identifying an existing dimension line associated with the 3D model, wherein selecting the dimension line of the candidate dimension lines is further based on whether the existing dimension line is placed in a linear relationship with any of the candidate dimension lines.

14. The system of claim 9 wherein the slip type includes one of:
a scope slip type causing the calculated planes to directly correspond to the scope;
a billboard slip type causing the calculated planes to directly correspond to a current camera view of the 3D model; or
an object slip type causing the calculated planes to directly correspond to dimensions of the 3D model.

15. The system of claim 9 wherein the dimension line placement guidelines include one or more of the following:
dimension lines placed outside of 3D model where possible;
dimension lines maintain a minimum defined distance from the 3D model and existing dimension lines;
dimension lines located in planes which they apply or normal to a viewing direction of the 3D model;
dimension lines are only shown for visible features;
avoid placement of intersecting dimension lines; and
group co-linear dimension lines where possible.

16. The system of claim 9 further comprising instructions configured to cause the one or more processors to perform operations including:
displaying a user-manipulatable handle on the selected dimension line, the handle to dynamically control a length of the one or more base lines in real-time;
receiving a user input corresponding to a movement of the handle; and
manipulating the shape of the 3D model based on the movement of the handle.

17. A computer-implemented method comprising:
receiving image data corresponding to a three-dimensional (3D) parametric model;
displaying a dimension line adjacent to the parametric model, the dimension line corresponding to a base line on the parametric model, wherein the dimension line is positioned to avoid obscuring the parametric model;
receiving a user input corresponding to a change in a viewpoint of the 3D parametric model;
changing the orientation of the 3D parametric model based on the user input; and
repositioning the dimension line in real-time as the orientation of the 3D parametric model is rotated, wherein the dimension line is positioned such that it does not obscure the parametric model.

18. The method of claim 17 further comprising:
displaying a user-controllable handle on the dimension line to control a length of the corresponding base line;
receiving a user input corresponding to a user-manipulation of the handle on the dimension line; and
changing the shape of the 3D parametric model based on the user input.

* * * * *